(12) United States Patent
Ko et al.

(10) Patent No.: US 12,453,171 B2
(45) Date of Patent: Oct. 21, 2025

(54) SEMICONDUCTOR DEVICE HAVING A NON-LINEAR GATE SEPARATION STRUCTURE

(71) Applicant: SAMSUNG ELECTRONICS CO., LTD., Suwon-si (KR)

(72) Inventors: Myung-Dong Ko, Hwaseong-si (KR); Keon Yong Cheon, Yongin-si (KR); Dong Won Kim, Seongnam-si (KR); Hyun Suk Kim, Suwon-si (KR); Sang Hyeon Lee, Gwangju-si (KR); Hyung Suk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 706 days.

(21) Appl. No.: 17/718,703

(22) Filed: Apr. 12, 2022

(65) Prior Publication Data
US 2023/0019860 A1     Jan. 19, 2023

(30) Foreign Application Priority Data

Jul. 16, 2021    (KR) .......................... 10-2021-0093173

(51) Int. Cl.
*H10D 84/83*       (2025.01)
*H01L 21/28*       (2025.01)
(Continued)

(52) U.S. Cl.
CPC ....... *H10D 84/83* (2025.01); *H01L 21/28123* (2013.01); *H10D 30/6735* (2025.01);
(Continued)

(58) Field of Classification Search
CPC ........ H10D 30/501–509; H10D 30/019–0198; H10D 84/832; H10D 62/121;
(Continued)

(56) References Cited

U.S. PATENT DOCUMENTS 10,176,995 B1    1/2019   Wu et al.
10,199,378 B2    2/2019   Jain et al.
(Continued)

FOREIGN PATENT DOCUMENTS

KR    10-2019-0063353 A    6/2019
KR    10-2019-0112910 A    10/2019
(Continued)

*Primary Examiner* — Kevin Parendo
(74) *Attorney, Agent, or Firm* — Muir Patent Law, PLLC

(57) ABSTRACT

A semiconductor device including a substrate; first and second active patterns on the substrate, extending in a first direction and spaced apart in a second direction; gate electrodes on the first and second active patterns and extending in the second direction; a first gate separation structure between the first and second active patterns, extending in the first direction, and separating the gate electrodes; and a first element separation structure between the gate electrodes, extending in the second direction, and separating the second active pattern, wherein a distance to a first side of a first portion of the first gate separation structure is smaller than a distance to the first side of a second portion of the first gate separation structure, and a distance to the second side of the first portion is smaller than a distance from the second active pattern to the second side of the second portion.

20 Claims, 31 Drawing Sheets

(51) Int. Cl.
  *H10D 30/67* (2025.01)
  *H10D 62/10* (2025.01)
  *H10D 84/01* (2025.01)
  *H10D 84/03* (2025.01)
  *H10D 89/10* (2025.01)

(52) U.S. Cl.
  CPC ....... *H10D 30/6757* (2025.01); *H10D 62/118* (2025.01); *H10D 62/121* (2025.01); *H10D 84/0135* (2025.01); *H10D 84/0151* (2025.01); *H10D 84/038* (2025.01); *H10D 84/832* (2025.01); *H10D 89/10* (2025.01)

(58) Field of Classification Search
  CPC .. H10D 84/834; H10D 84/851; H10D 84/853; H10D 30/62–6219; H10D 30/024–0245; H10D 84/0158; H10D 84/0193; H10D 86/011; H10D 84/0151; H10D 84/0188; H01L 27/088; H01L 29/78696; H01L 29/0673; H01L 27/0886; H01L 27/092; H01L 27/0924; H01L 29/785; H01L 29/7851; H01L 29/7853; H01L 29/7854; H01L 29/7855; H01L 29/7856; H01L 21/823481; H01L 21/823878
  See application file for complete search history.

(56) References Cited

U.S. PATENT DOCUMENTS

| | | | |
|---|---|---|---|
| 10,276,488 | B2 | 4/2019 | Liu et al. |
| 10,325,819 | B1* | 6/2019 | Gao .................. H01L 21/76224 |
| 10,325,912 | B2* | 6/2019 | Chen ..................... H10D 64/017 |
| 10,707,206 | B2 | 7/2020 | Zang et al. |
| 10,756,087 | B2 | 8/2020 | Wu et al. |
| 2019/0267374 | A1* | 8/2019 | Hung ................. H01L 21/31116 |
| 2019/0386002 | A1* | 12/2019 | Wu ...................... H10D 64/017 |
| 2020/0006557 | A1* | 1/2020 | Ko ....................... H10D 30/024 |
| 2020/0044070 | A1 | 2/2020 | Wang et al. |
| 2020/0258745 | A1* | 8/2020 | Xu ....................... H10D 64/017 |
| 2020/0343363 | A1 | 10/2020 | Lin et al. |
| 2020/0381432 | A1 | 12/2020 | Lee et al. |
| 2021/0183855 | A1* | 6/2021 | Ng .................... H01L 21/76232 |
| 2021/0335670 | A1* | 10/2021 | Ko ..................... H10D 30/0243 |
| 2022/0093592 | A1* | 3/2022 | Guler ................ H10D 84/0151 |

FOREIGN PATENT DOCUMENTS

| | | |
|---|---|---|
| KR | 10-2019-0140647 A | 12/2019 |
| KR | 10-2020-0012519 A | 2/2020 |
| KR | 10-2021-0009503 A | 1/2021 |

* cited by examiner

SEMICONDUCTOR DEVICE HAVING A NON-LINEAR GATE SEPARATION STRUCTURE

CROSS-REFERENCE TO RELATED APPLICATION

This application claims priority from Korean Patent Application No. 10-2021-0093173, filed on Jul. 16, 2021, in the Korean Intellectual Property Office, and all the benefits accruing therefrom under 35 U.S.C. § 119, the contents of which in its entirety are herein incorporated by reference.

BACKGROUND

1. Field

Embodiments relate to a semiconductor device.

2. Description of the Related Art

With rapid supply of information media in recent years, the functions of semiconductor devices have also been rapidly developed. In the case of recent semiconductor products, a low cost may secure competitiveness and a high integration of product may contribute to high quality. For high integration, semiconductor devices may be scaled down.

SUMMARY

The embodiments may be realized by providing a semiconductor device including a substrate; a first active pattern on the substrate and extending in a first direction; a second active pattern on the substrate, extending in the first direction, and being spaced apart from the first active pattern in a second direction intersecting the first direction; gate electrodes on the first active pattern and the second active pattern and extending in the second direction to intersect the first active pattern and the second active pattern; a first gate separation structure between the first active pattern and the second active pattern, the first gate separation structure extending in the first direction and separating the gate electrodes into separate parts; and a first element separation structure between the gate electrodes, the first element separation structure extending in the second direction and separating the second active pattern into separate parts, wherein the first gate separation structure includes a first side facing the second active pattern, and a second side opposite to the first side, from a planar viewpoint, a distance from the second active pattern to the first side of a first portion of the first gate separation structure is smaller than a distance from the second active pattern to the first side of a second portion of the first gate separation structure, and a distance from the second active pattern to the second side of the first portion is smaller than a distance from the second active pattern to the second side of the second portion.

The embodiments may be realized by providing a semiconductor device including a substrate; a first active pattern on the substrate and extending in a first direction; a second active pattern on the substrate, the second active pattern extending in the first direction and being spaced apart from the first active pattern in a second direction intersecting the first direction; gate electrodes on the first active pattern and the second active pattern and extending in the second direction to intersect the first active pattern and the second active pattern; a gate separation structure between the first active pattern and the second active pattern, the gate separation structure extending in the first direction and separating the gate electrodes into separate parts; and an element separation structure between the gate electrodes, the element separation structure extending in the second direction and completely separating the second active pattern into two separate parts, wherein at least a part of a bottom side of the gate separation structure overlaps the first active pattern in a third direction that intersects the first direction and the second direction.

The embodiments may be realized by providing a semiconductor device including a substrate; a first active pattern, a second active pattern, a third active pattern, and a fourth active pattern on the substrate, the first to fourth active patterns extending in a first direction and being spaced apart from each other in a second direction intersecting the first direction; gate electrodes on the first to fourth active patterns and extending in the second direction to intersect the first to fourth active patterns; a first gate separation structure between the first active pattern and the second active pattern, the first gate separation structure extending in the first direction, and separating corresponding ones of the gate electrodes into separate parts; a second gate separation structure between the third active pattern and the fourth active pattern, the second gate separation structure extending in the first direction, and separating corresponding ones of the gate electrodes into separate parts; and an element separation structure between the gate electrodes, the element separation structure extending in the second direction, and separating each of the second active pattern and the third active pattern into separate parts, wherein the first gate separation structure includes a first side facing the second active pattern and a second side opposite to the first side, the second gate separation structure includes a third side facing the fourth active pattern and a fourth side opposite to the third side, from a planar viewpoint a distance from the second active pattern to the first side of a first portion of the first gate separation structure is smaller than a distance from the second active pattern to the first side of a second portion of the first gate separation structure, a distance from the second active pattern to the second side of the first portion of the first gate separation structure is smaller than a distance from the second active pattern to the second side of the second portion of the first gate separation structure, a distance from the fourth active pattern to the third side of a first portion of the second gate separation structure is greater than a distance from the fourth active pattern to the third side of a second portion of the second gate separation structure, and a distance from the fourth active pattern to the fourth side of the first portion of the second gate separation structure is greater than a distance from the fourth active pattern to the fourth side of the second portion of the second gate separation structure, and the element separation structure is between the second portion of the first gate separation structure and the second portion of the second gate separation structure.

BRIEF DESCRIPTION OF THE DRAWINGS

Features will be apparent to those of skill in the art by describing in detail exemplary embodiments with reference to the attached drawings in which.

DETAILED DESCRIPTION

Although drawings of a semiconductor device according to some embodiments may show a fin-type transistor (FinFET) including a channel region of a fin-type pattern shape, a transistor including a nanowire or a nanosheet, and a MBCFET™ (Multi-Bridge Channel Field Effect Transistor) as an example, the embodiments are not limited thereto. The semiconductor device according to some embodiments may, of course, include a tunneling transistor (tunneling FET) or a three-dimensional (3D) transistor. The semiconductor device according to some embodiments may, of course, include a planar transistor. In addition, the technical idea of the present disclosure may be applied to a transistor based on two-dimensional material (2D material based FETs) and a heterostructure thereof.

Further, the semiconductor device according to some embodiments may also include a bipolar junction transistor, a laterally diffused metal oxide semiconductor (LDMOS), or the like.

Hereinafter, the semiconductor device according to some embodiments will be described referring to FIGS. 1 to 18.

Figure 1:
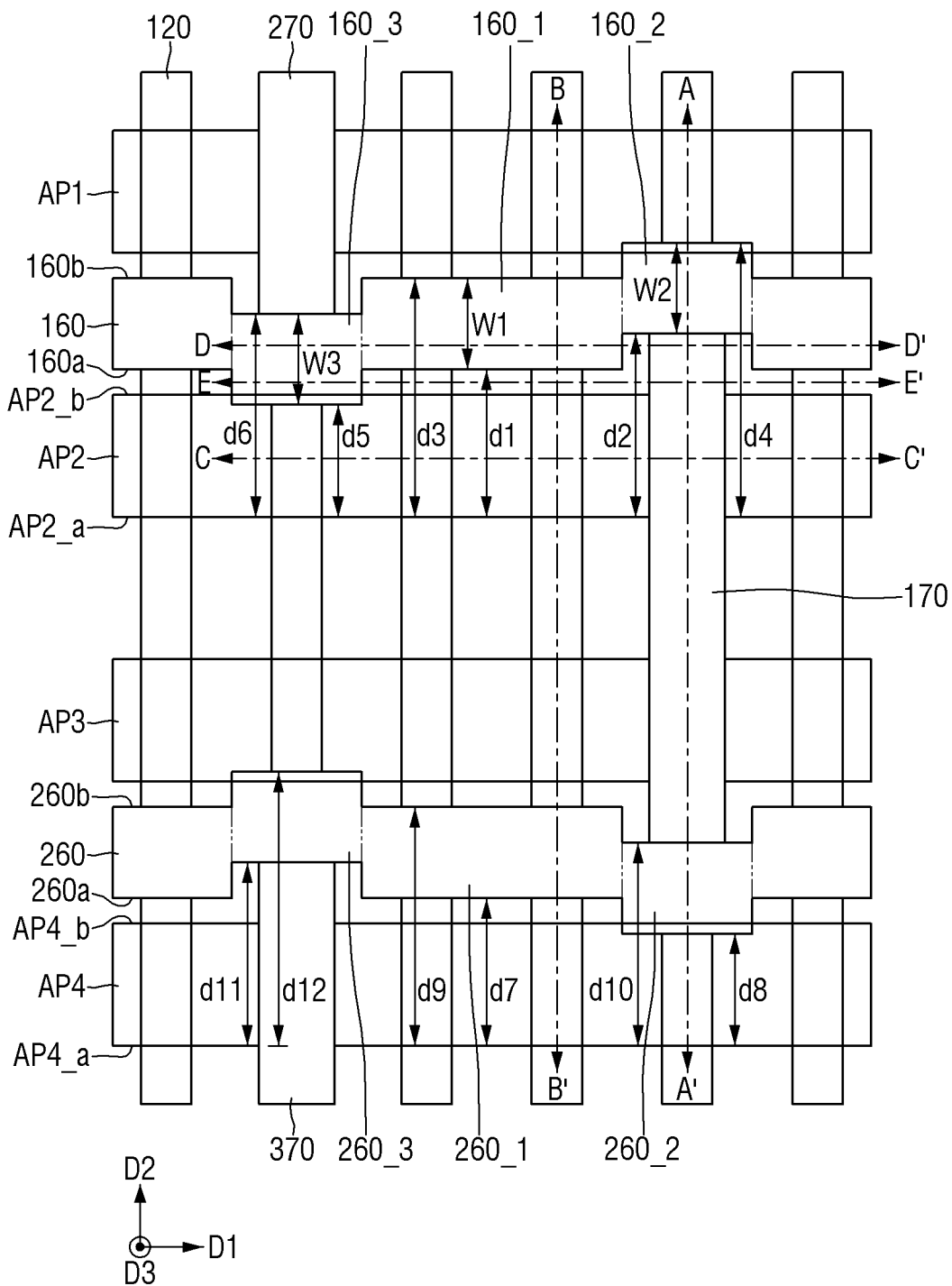
FIG. 1 is a layout view of a semiconductor device according to some embodiments.
Figure 2:
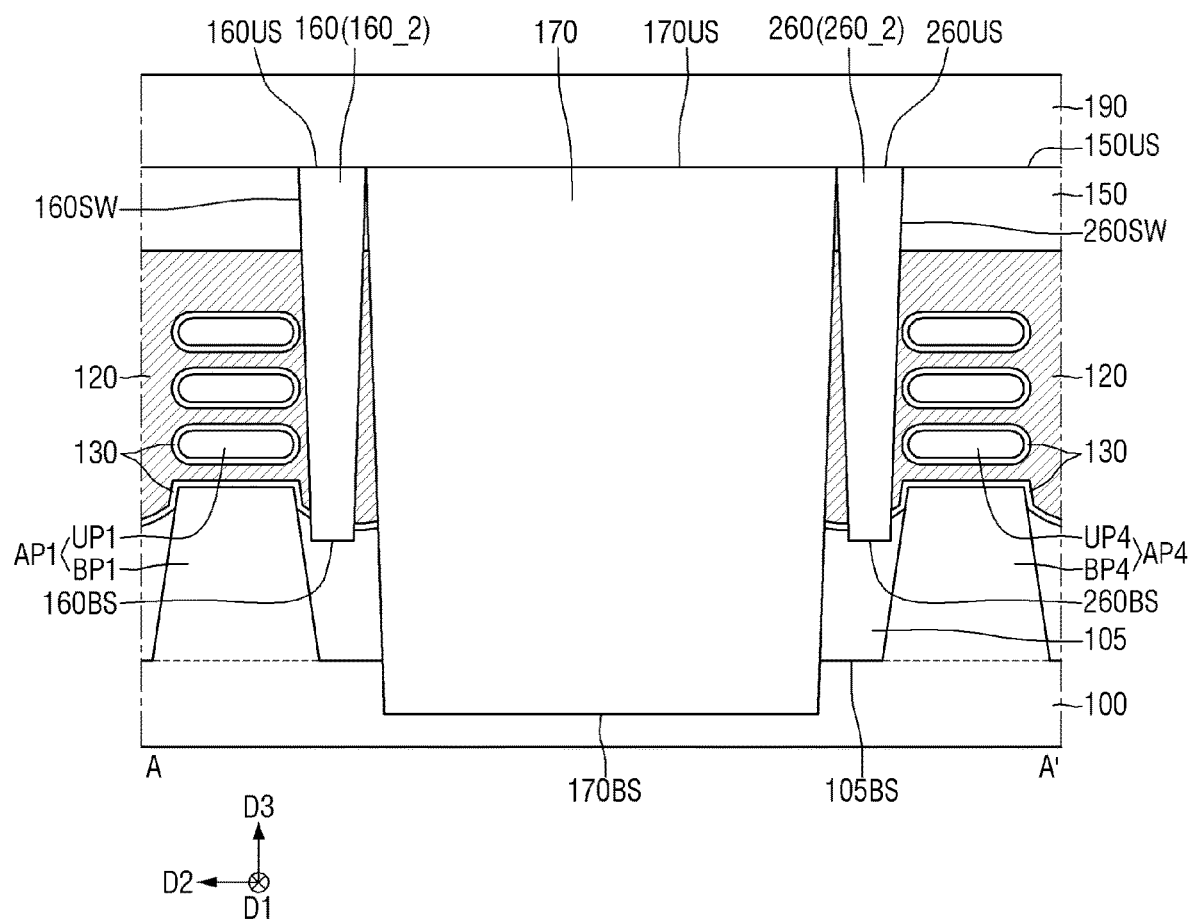
FIG. 2 is a cross-sectional view taken along A-A' of FIG. 1.
Figure 3:
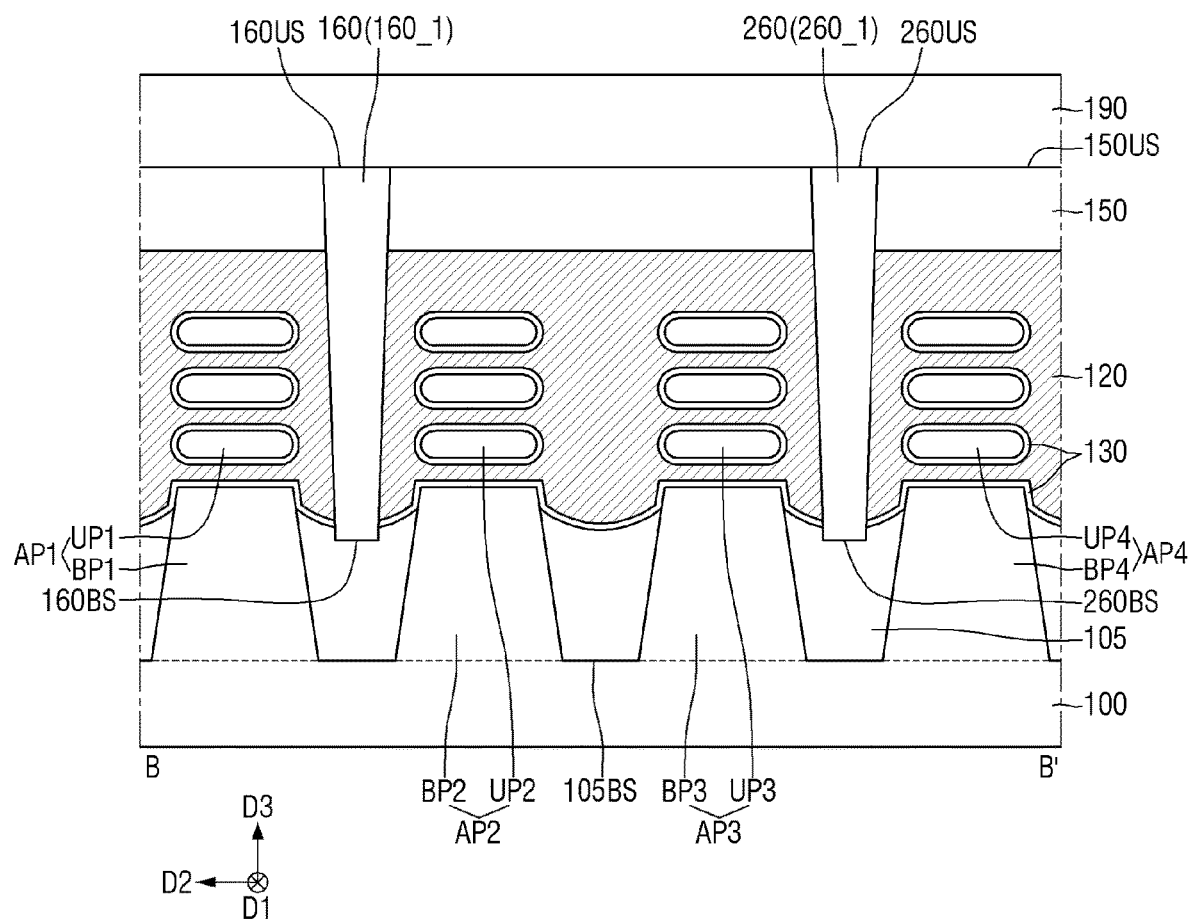
FIG. 3 is a cross-sectional view taken along B-B' of FIG. 1.
Figure 4A:
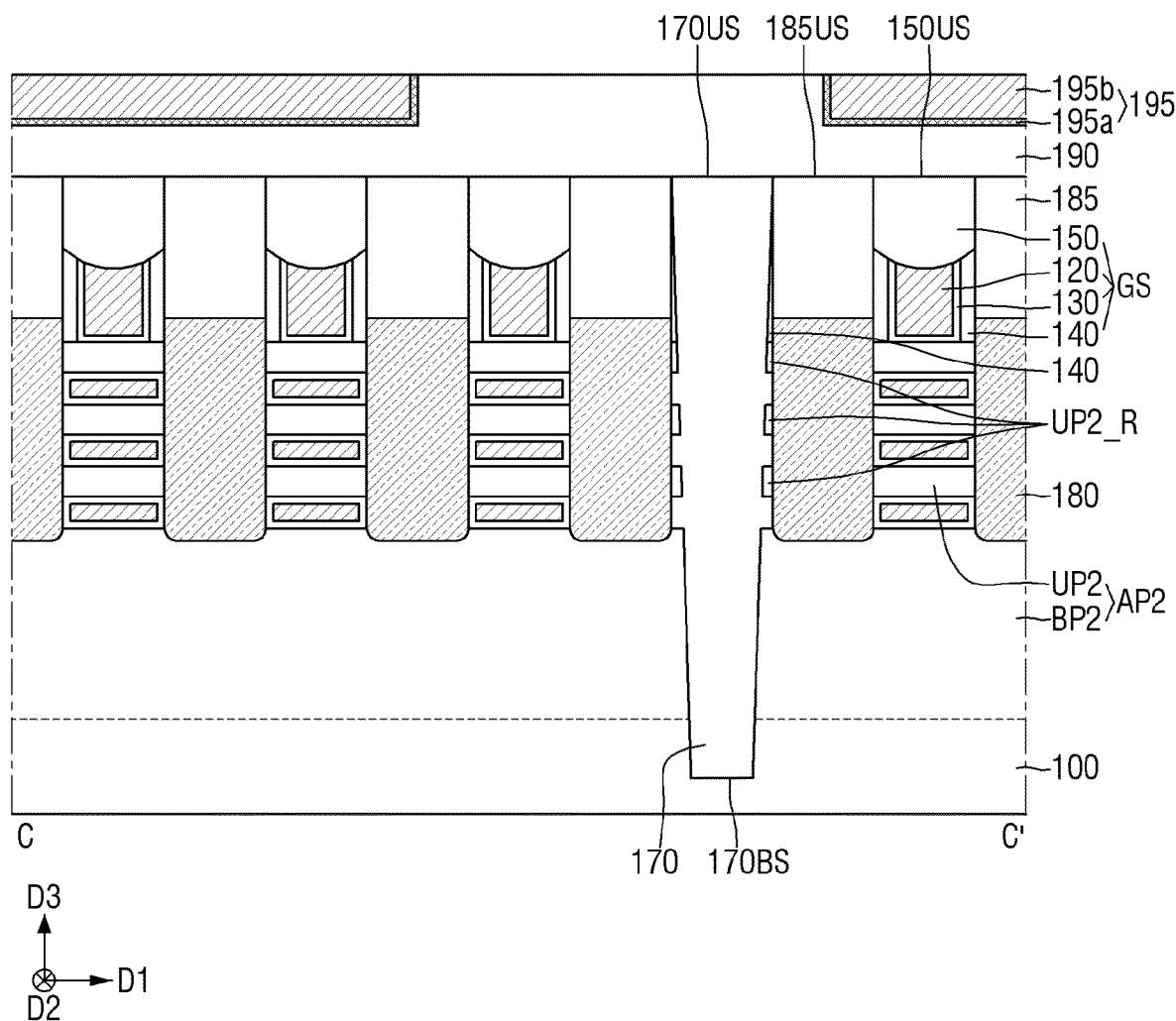
FIGS. 4A and 4B are cross-sectional views taken along C-C' of FIG. 1.
Figure 4B:
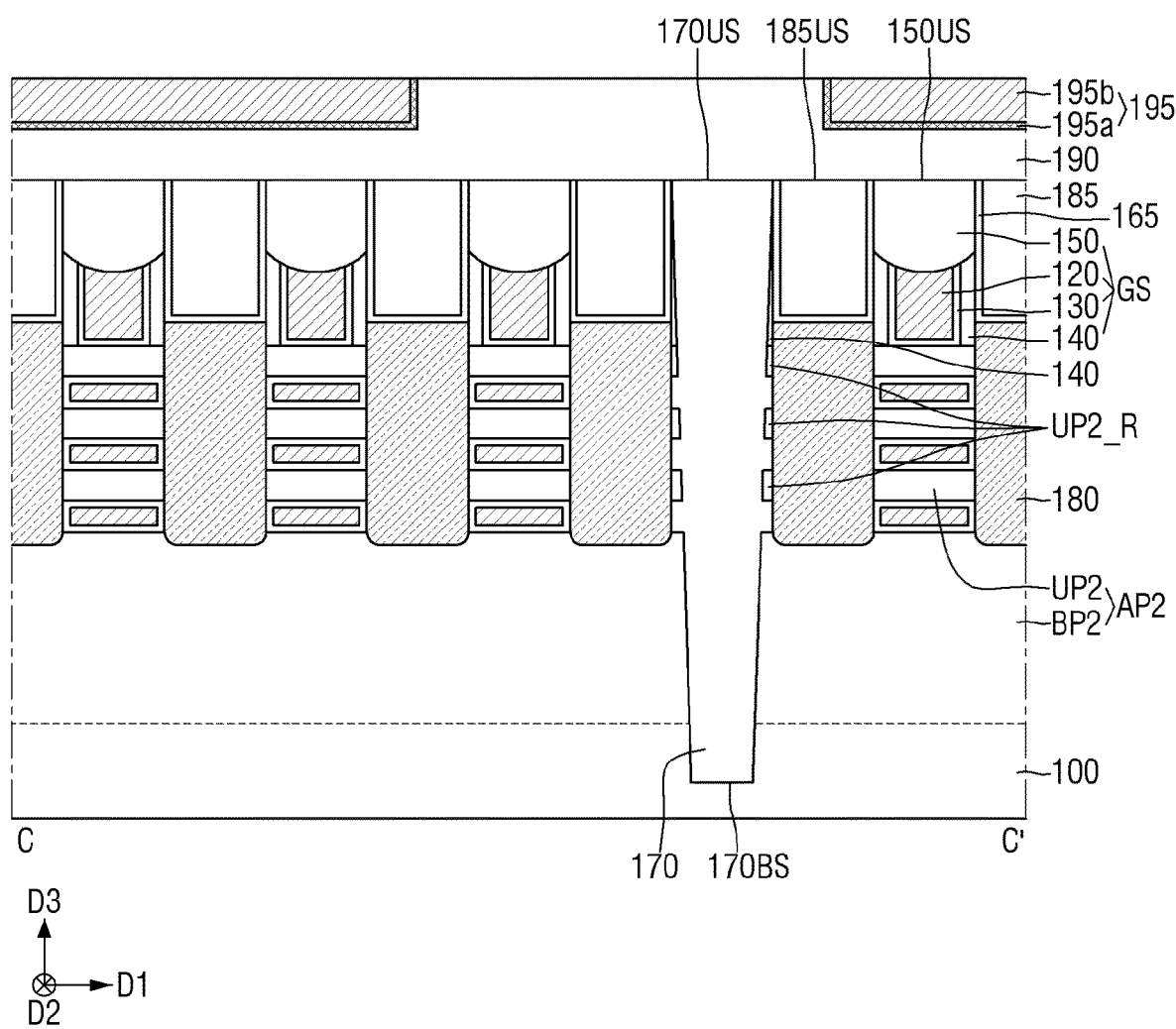
Figure 5:
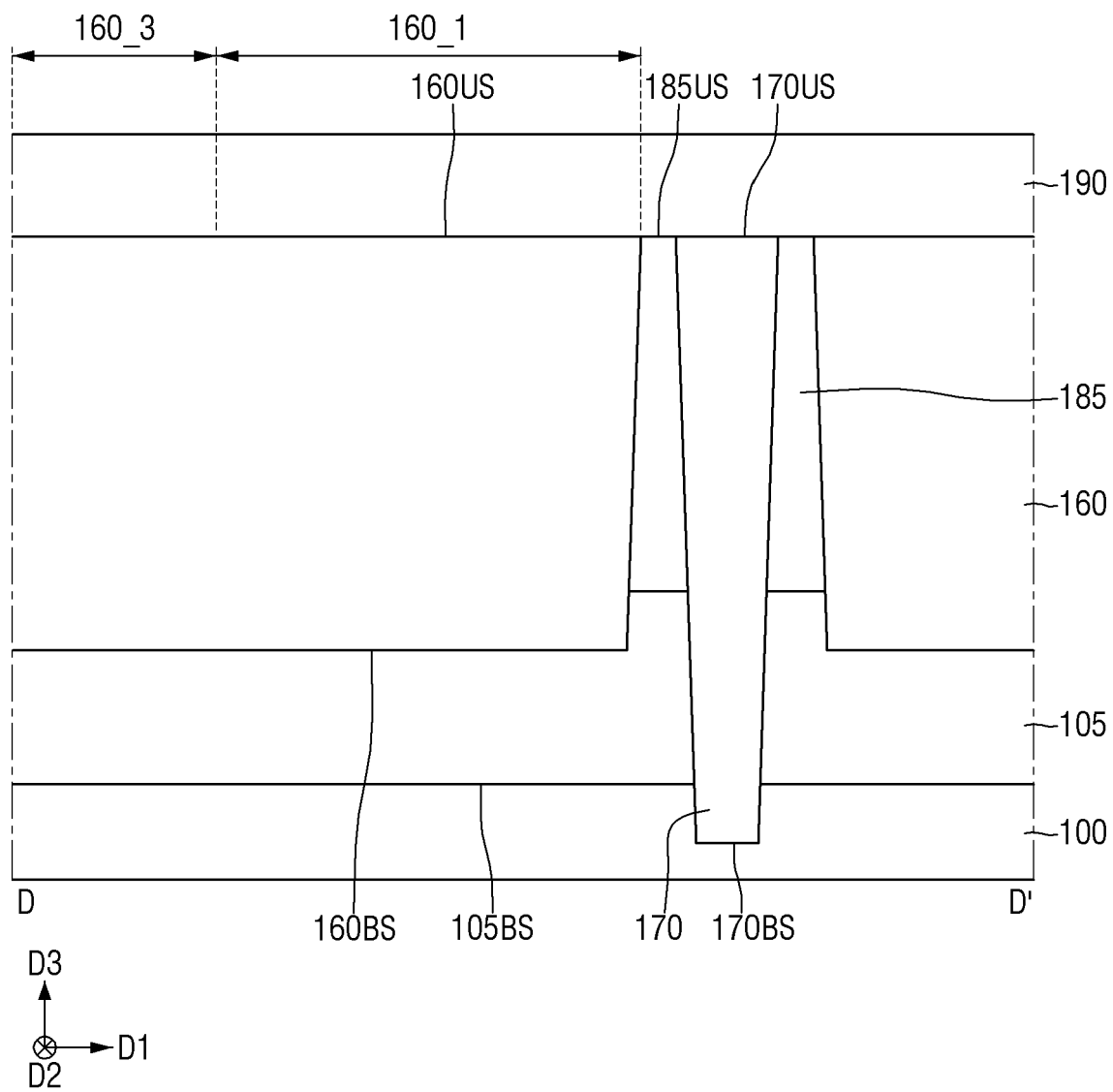
FIG. 5 is a cross-sectional view taken along D-D' of FIG. 1.
Figure 6:
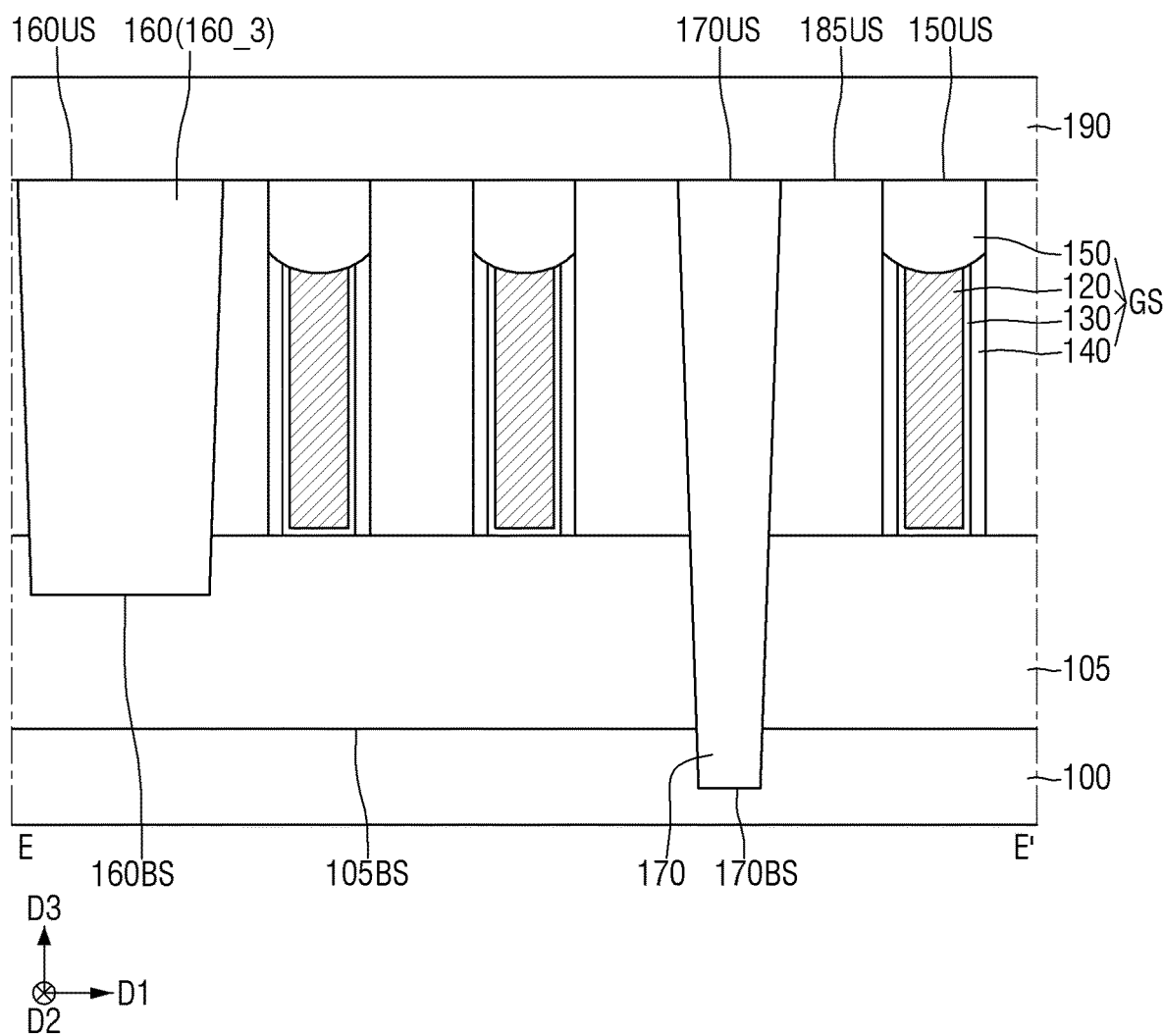
FIG. 6 is a cross-sectional view taken along D-D' of FIG. 1.

FIG. 1 is a layout view of a semiconductor device according to some embodiments. FIG. 2 is a cross-sectional view taken along A-A' of FIG. 1. FIG. 3 is a cross-sectional view taken along B-B' of FIG. 1. FIGS. 4A and 4B are cross-sectional views taken along C-C' of FIG. 1. FIG. 5 is a cross-sectional view taken along D-D' of FIG. 1. FIG. 6 is a cross-sectional view taken along D-D' of FIG. 1.

Referring to FIGS. 1 to 6, the semiconductor device according to some embodiments may include a substrate 100, a gate electrode 120, first to fourth active patterns AP1 to AP4, a first gate separation structure 160, a second gate separation structure 260, a first element separation structure 170, a second element separation structure 270, and a third element separation structure 370. As used herein, the terms "first," "second," and the like are merely for identification and differentiation, and are not intended to imply or require sequential inclusion (e.g., a third element and a fourth element may be described without implying or requiring the presence of a first element or second element).

In an implementation, the substrate 100 may include an active region and a field region. The field region may be between adjacent active regions. The active region may be a region in which the first to fourth active patterns AP1 to AP4 are placed. The field region may form a boundary with the active region. The active region may be separated by the field region.

Described in another way, an element separation film may be around a plurality of active regions that are spaced apart from each other. A portion of the element separation film between the active regions may be the field region. In an implementation, a portion in which a channel region of the transistor which may be an example of a semiconductor device is formed may be the active region, and a portion that divides the channel region of the transistor formed in the active region may be the field region. In an implementation, the active region is a portion in which the fin-type pattern or nanosheet used as the channel region of the transistor is formed, and the field region may be a region in which the fin-type pattern or nanosheet used as the channel region is not formed.

The substrate 100 may be a silicon substrate or an SOI (silicon-on-insulator). In an implementation, the substrate 100 may include, e.g., silicon germanium, SGOI (silicon germanium on insulator), indium antimonide, lead tellurium compounds, indium arsenide, indium phosphide, gallium arsenide, or gallium antimonide. As used herein, the term "or" is not an exclusive term, e.g., "A or B" would include A, B, or A and B.

First to fourth active patterns AP1 to AP4 may protrude (e.g., in a vertical or third direction D3) from the substrate 100. The first to fourth active patterns AP1 to AP4 may extend lengthwise along a first direction D1 on the substrate 100. In an implementation, the first to fourth active patterns AP1 to AP4 may include a long side extending in the first direction D1, and a short side extending in a second direction D2. Here, the first direction D1 may intersect the second direction D2 and the third direction D3. Also, the second direction D2 may intersect the third direction D3.

The first to fourth active patterns AP1 to AP4 may be spaced apart from each other in the second direction D2. The first active pattern AP1, the second active pattern AP2, the third active pattern AP3, and the fourth active pattern AP4 may be sequentially spaced apart from each other in the second direction D2. In an implementation, the second active pattern AP2 may be between the first active pattern AP1 and the third active pattern AP3. The third active pattern AP3 may be between the second active pattern AP2 and the fourth active pattern AP4.

Each of the first to fourth active patterns AP1 to AP4 may be multi-channel active patterns. In the semiconductor device according to some embodiments, the first to fourth active patterns AP1 to AP4 may include a lower pattern and a sheet pattern.

In an implementation, the first active pattern AP1 may include a first lower pattern BP1 and a first sheet pattern UP1. The first sheet pattern UP1 may be spaced apart from the first lower pattern BP1 in the third direction D3. In an implementation, as illustrated in the drawings, three first sheet patterns UP1 may be included.

The second active pattern AP2 may include a second lower pattern BP2 and a second sheet pattern UP2. The third active pattern AP3 may include a third lower pattern BP3 and a third sheet pattern UP3. The fourth active pattern AP4 may include a fourth lower pattern BP4 and a fourth sheet pattern UP4. The second active pattern AP2 to the fourth active pattern AP4 may be substantially the same as the first active pattern AP1.

In an implementation, as illustrated in the drawings, one of each of first to fourth active patterns AP1 to AP4 may be included. In an implementation, the number of first to fourth active patterns AP1 to AP4 may each be one or more.

Each of the first to fourth active patterns AP1 to AP4 may be a part of the substrate 100, and may include an epitaxial layer that is grown from the substrate 100. The first to fourth active patterns AP1 to AP4 may include, e.g., silicon or germanium, which are elemental semiconductor materials. Further, the first to fourth active patterns AP1 to AP4 may include a compound semiconductor, and may include, e.g., a group IV-IV compound semiconductor or a group III-V compound semiconductor.

The group IV-IV compound semiconductor may include, e.g., a binary compound or a ternary compound including two or more of carbon (C), silicon (Si), germanium (Ge), and tin (Sn), or a compound obtained by doping these elements with a group IV element.

The group III-V compound semiconductor may be, e.g., a binary compound, a ternary compound, or a quaternary compound formed by combining at least one of aluminum (Al), gallium (Ga) and indium (In) as a group III element with one of phosphorus (P), arsenic (As) and antimony (Sb) as a group V element.

In an implementation, the first to fourth active patterns AP1 to AP4 may include the same material. In an implementation, the first to fourth active patterns AP1 to AP4 may include different materials from each other.

The field insulating film 105 may be on a part of the side wall of the first active pattern AP1, a part of the side wall of the second active pattern AP2, a part of the side wall of the third active pattern AP3, and a part of the fourth active pattern AP4. The field insulating film 105 may be on a part of the side wall of the first lower pattern BP1, a part of the side wall of the second lower pattern BP2, a part of the side wall of the third lower pattern BP3, and a part of the side wall of the fourth lower pattern BP4. Each of the first to fourth lower patterns BP1 to BP4 may protrude upwardly from an upper side of the field insulating film 105. The field insulating film 105 may include, e.g., an oxide film, a nitride film, an oxynitride film, or a combined film thereof.

A plurality of gate structures GS may be on the substrate 100. The gate structures GS may extend in the second direction D2. The plurality of gate structures GS may be on the field insulating film 105. Each of the gate structures GS may be spaced apart from one another in the first direction D1.

The gate structure GS may be on the first active pattern AP1, the second active pattern AP2, the third active pattern AP3, and the fourth active pattern AP4. The gate structure GS may intersect the first active pattern AP1, the second active pattern AP2, the third active pattern AP3 and the fourth active pattern AP4.

The gate structure GS may be separated into three parts by the first gate separation structure 160 and the second gate separation structure 260. The first gate separation structure 160 and the second gate separation structure 260 will be described below.

The gate structure GS may include, e.g., a gate electrode 120, a gate insulating film 130, a gate spacer 140, and a gate capping pattern 150.

The gate electrode 120 may be on the first active pattern AP1, the second active pattern AP2, the third active pattern AP3, and the fourth active pattern AP4. The gate electrode 120 may intersect the first active pattern AP1, the second active pattern AP2, the third active pattern AP3, and the fourth active pattern AP4. The gate electrode 120 may surround a first lower pattern BP1, a second lower pattern BP2, a third lower pattern BP3, and a fourth lower pattern BP4 that protrude from the upper side of the field insulating film 105.

In an implementation, the gate electrode 120 may surround a first sheet pattern UP1 separated from the first lower pattern BP1, a second sheet pattern UP2 separated from the second lower pattern BP2, a third sheet pattern UP3 separated from the third lower pattern BP3, and a fourth sheet pattern UP4 separated from the fourth lower pattern BP4. The gate electrode 120 may include a long side extending in the second direction D2, and a short side extending in the first direction D1.

The upper side of the gate electrode 120 may be, e.g., a concave curved surface that is recessed toward the upper sides of the first to fourth active patterns AP1 to AP4. In an implementation, the upper side of the gate electrode 120 may also be a flat plane The gate electrode 120 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof.

The gate electrode 120 may include a conductive metal oxide, a conductive metal oxynitride, or the like, and may also include an oxidized form of the above-mentioned materials.

The gate spacer 140 may be on the side wall of the gate electrode 120. The gate spacer 140 may extend in the second direction D2.

The gate spacer 140 may include, e.g., silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), or combinations thereof.

The gate insulating film 130 may extend along the side walls and bottom side of the gate electrode 120. The gate insulating film 130 may be on the first active pattern AP1, the second active pattern AP2, the third active pattern AP3, and the fourth active pattern AP4. The gate insulating film 130 may be between the gate electrode 120 and the gate spacer 140. The gate insulating film 130 may extend along the upper sides of the first to fourth lower patterns BP1 to BP4 and the upper side of the field insulating film 105. The gate insulating film 130 may surround the first to fourth sheet patterns UP1 to UP4.

The gate insulating film 130 may include silicon oxide, silicon oxynitride, silicon nitride, or a high dielectric constant material having a higher dielectric constant than silicon oxide. The high dielectric constant material may include, e.g., boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some other embodiments may include an NC (Negative Capacitance) FET that uses a negative capacitor. In an implementation, the gate insulating film 130 may include a ferroelectric material film having ferroelectric properties, and a paraelectric material film having paraelectric properties.

The ferroelectric material film may have a negative capacitance, and the paraelectric material film may have a positive capacitance. In an implementation, when two or more capacitors are connected in series, and the capacitance of each capacitor has a positive value, the entire capacitance decreases from the capacitance of each individual capacitor. In an implementation, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) of 60 mV/decade or less at room temperature.

The ferroelectric material film may have ferroelectric properties. The ferroelectric material film may include, e.g., hafnium oxide, hafnium zirconium oxide, barium strontium titanium oxide, barium titanium oxide, or lead zirconium titanium oxide. In an implementation, the hafnium zirconium oxide may be a material obtained by doping hafnium oxide with zirconium (Zr). In an implementation, the hafnium zirconium oxide may be a compound of hafnium (Hf), zirconium (Zr), and oxygen (O).

The ferroelectric material film may further include a doped dopant. In an implementation, the dopant may include aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, e.g., gadolinium (Gd), silicon (Si), zirconium (Zr), aluminum (Al), or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include, e.g., a silicon oxide or a metal oxide having a high dielectric constant. The metal oxide included in the paraelectric material film may include, e.g., hafnium oxide, zirconium oxide, or aluminum oxide.

The ferroelectric material film and the paraelectric material film may include the same material. The ferroelectric material film has the ferroelectric properties, and the paraelectric material film may not have the ferroelectric properties. In an implementation, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, e.g., 0.5 to 10 nm. A critical thickness that exhibits the ferroelectric properties may vary for each ferroelectric material, and the thickness of the ferroelectric material film may vary depending on the ferroelectric material.

In an implementation, the gate insulating film 130 may include a single ferroelectric material film. In an implementation, the gate insulating film 130 may include a plurality of ferroelectric material films spaced apart from each other. The gate insulating film 130 may have a stacked film structure in which a plurality of ferroelectric material films and a plurality of paraelectric material films are alternately stacked.

The gate capping pattern 150 may be placed on the upper side of the gate electrode 120 and the upper side of the gate spacer 140. The gate capping pattern 150 may include, e.g., silicon nitride (SiN), silicon oxynitride (SiON), silicon oxide (SiO$_2$), silicon carbonitride (SiCN), silicon oxycarbonitride (SiOCN), or combinations thereof.

In an implementation, the gate capping pattern 150 may be between the gate spacers 140. In such a case, an upper side 150 US of the gate capping pattern 150 may be on the same plane as the upper side of the gate spacer 140. The upper side 150 US of the gate capping pattern 150 may be the upper side of the gate structure GS. The upper side 150 US of the gate capping pattern 150 may be on the same plane as an upper side 160US of the first gate separation structure 160, an upper side 260US of the second gate separation structure 260, an upper side 170US of the first element separation structure 170, and an upper side 185US of the first interlayer insulating film 185.

The first gate separation structure 160 and the second gate separation structure 260 may separate the gate electrode 120. The first gate separation structure 160 may separate the gate electrode 120, between the first active pattern AP1 and the second active pattern AP2. The second gate separation structure 260 may separate the gate electrode 120, between the third active pattern AP3 and the fourth active pattern AP4. The first gate separation structure 160 and the second gate separation structure 260 may penetrate the gate electrode 120 and the gate insulating film 130 on the field insulating film 105.

The first gate separation structure 160 and the second gate separation structure 260 may extend (e.g., lengthwise) in the first direction D1. The first gate separation structure 160 and the second gate separation structure 260 may be spaced apart from each other in the second direction D2. The first gate separation structure 160 may include a long side extending in the first direction D1, and a short side extending in the second direction D2. The second gate separation structure 160 may include a long side extending in the first direction D1, and a short side extending in the second direction D2.

The first gate separation structure 160 may include a first side 160a and a second side 160b extending in the first direction D1. The first side 160a may be a side facing the second active pattern AP2. The second side 160b may be a side opposite to the first side 160a. The second gate separation structure 260 may include a third side 260a and a fourth side 260b extending in the first direction D1. The third side 260a may be a side facing the fourth active pattern AP4. The fourth side 260b may be a side opposite to the third side 260a.

In an implementation, a width of the first gate separation structure 160 in the second direction D2 may be constant. In an implementation, a width or distance between the first side 160a and the second side 160b of the first gate separation structure 160 may be constant. In an implementation, a width W1 of a first portion 160_1 of the first gate separation structure 160 in the second direction D2, a width W2 of a second portion 160_2 of the first gate separation structure 160 in the second direction D2, and a width W3 of a third portion 160_3 of the first gate separation structure 160 in the second direction D2 may be the same.

The width of the second gate separation structure 260 in the second direction D2 may be constant. In an implementation, the width or distance between the third side 260a and the fourth side 260b of the second gate separation structure 260 may be constant.

In an implementation, the first gate separation structure 160 and the second gate separation structure 260 may have a zigzag or roughly non-linear shape from a planar view point. In an implementation, each of the first side 160a and the second side 160b of the first gate separation structure 160 and the third side 260a and the fourth side 260b of the second gate separation structure 260 may not be a straight line extending in the first direction D1.

In an implementation, the first gate separation structure 160 may include the first portion 160_1, the second portion 160_2, and the third portion 160_3. The first portion 160_1 may be between the second portion 160_2 and the third portion 160_3. A distance (e.g., in the second direction D2) from the second active pattern AP2 to the first portion 160_1 may be smaller than a distance from the second active pattern AP2 to the second portion 160_2. A distance from the second active pattern AP2 to the first portion 160_1 may be greater than a distance from the second active pattern AP2 to the third portion 160_3.

In an implementation, a distance d1 from the second active pattern AP2 to the first side 160a of the first portion 160_1 of the first gate separation structure 160 may be smaller than a distance d2 from the second active pattern AP2 to the first side 160a of the second portion 160_2 of the first gate separation structure 160.

The second active pattern AP2 may include an upper side AP2_b facing the first gate separation structure 160, and a lower side AP2_a opposite to the upper side AP2_b. In the present specification, the description of the distance from the second active pattern AP2 to 'A' means a distance from the lower side AP2_a of the second active pattern AP2 to 'A', e.g., in the second direction D2.

In an implementation, the distance d1 from the second active pattern AP2 to the first side 160a of the first portion 160_1 of the first gate separation structure 160 means a distance from the lower side AP2_a of the second active pattern AP2 to the first side 160a of the first portion 160_1 of the first gate separation structure 160.

A distance d3 from the second active pattern AP2 to the second side 160b of the first portion 160_1 of the first gate separation structure 160 may be smaller than a distance d4 from the second active pattern AP2 to the second side 160b of the second portion 160_2 of the first gate separation structure 160. In an implementation, the second portion 160_2 of the first gate separation structure 160 may be closer (e.g., in the second direction D2) to the first active pattern AP1 than the first portion 160_1 of the first gate separation structure 160 is to the first active pattern AP1.

The distance d1 from the second active pattern AP2 to the first side 160a of the first portion 160_1 of the first gate separation structure 160 may be greater than a distance d5 from the second active pattern AP2 to the first side 160a of the third portion 160_3 of the first gate separation structure 160. The distance d3 from the second active pattern AP2 to the second side 160b of the first portion 160_1 of the first gate separation structure 160 may be greater than a distance d6 from the second active pattern AP2 to the second side 160b of the third portion 160_3 of the first gate separation structure 160. In an implementation, the third portion 160_3 of the first gate separation structure 160 may be closer to the second active pattern AP2 than the first portion 160_1 of the first gate separation structure 160 is to the second active pattern AP2.

The distance d2 from the second active pattern AP2 to the first side 160a of the second portion 160_2 of the first gate separation structure 160 may be the same as or smaller than the distance d6 from the second active pattern AP2 to the second side 160b of the third portion 160_3 of the first gate separation structure 160. In an implementation, the first element separation structure 170 may not overlap the second element separation structure 270 in the first direction D1.

The second gate separation structure 260 may include, e.g., a first portion 260_1, a second portion 260_2, and a third portion 260_3. The first portion 260_1 may be between the second portion 260_2 and the third portion 260_3.

The first gate separation structure 160 and the second gate separation structure 260 may be symmetrical (e.g., mirror images) with respect to an axis extending in the first direction D1.

In an implementation, a distance from the fourth active pattern AP4 to the first portion 260_1 of the second gate separation structure 260 may be greater than a distance from the fourth active pattern AP4 to the second portion 260_2 of the second gate separation structure 260. The distance from the fourth active pattern AP4 to the first portion 260_1 of the second gate separation structure 260 may be smaller than a distance from the fourth active pattern AP4 to the third portion 260_3 of the second gate separation structure 260.

The fourth active pattern AP4 may include an upper side AP4_b facing the second gate separation structure 260, and a lower side AP4_a opposite to the upper side AP4_b. In the present specification, the description of the distance from the fourth active pattern AP4 to 'A' means a distance from the lower side AP4_a of the fourth active pattern AP4 to 'A' (e.g., in the second direction D2).

In an implementation, a distance d7 from the fourth active pattern AP4 to the third side 260a of the first portion 260_1 of the second gate separation structure 260 means a distance from the lower side AP4_*a* of the fourth active pattern AP4 to the third side 260*a* of the first portion 260_1 of the second gate separation structure 260.

The distance d7 from the fourth active pattern AP4 to the third side 260*a* of the first portion 260_1 of the second gate separation structure 260 may be greater than a distance d8 from the fourth active pattern AP4 to the third side 260*a* of the second portion 260_2 of the second gate separation structure 260. A distance d9 from the fourth active pattern AP4 to the fourth side 260*b* of the first portion 260_1 of the second gate separation structure 260 may be greater than a distance d10 from the fourth active pattern AP4 to the fourth side 260*b* of the second portion 260_2 of the second gate separation structure 260. In an implementation, the second portion 260_2 of the second gate separation structure 260 may be closer to the fourth active pattern AP4 than to the first portion 260_1 of the second gate separation structure 260 is to the fourth active pattern AP4.

The distance d7 from the fourth active pattern AP4 to the third side 260*a* of the first portion 260_1 of the second gate separation structure 260 may be smaller than a distance d11 from the fourth active pattern AP4 to the third side 260*a* of the third portion 260_3 of the second gate separation structure 260. The distance d9 from the fourth active pattern AP4 to the fourth side 260*b* of the first portion 260_1 of the second gate separation structure 260 may be less than a distance d12 from the fourth active pattern AP4 to the fourth side 260*b* of the third portion 260_3 of the second gate separation structure 260. In an implementation, the first portion 260_1 of the second gate separation structure 260 may be closer to the fourth active pattern AP4 than the third portion 260_3 of the second gate separation structure 260 is to the fourth active pattern AP4.

The distance d10 from the fourth active pattern AP4 to the fourth side 260*b* of the second portion 260_2 of the second gate separation structure 260 may be the same as or greater than the distance d11 from the fourth active pattern AP4 to the third side 260*a* of the third portion 260_3 of the second gate separation structure 260. In an implementation, the first element separation structure 170 may not overlap the third element separation structure 370 in the first direction D1.

In FIG. 2, at least a part of the bottom side 160B S of the first gate separation structure 160 may overlap the first active pattern AP1 in the third direction D3. At least a part of the bottom side 260BS of the second gate separation structure 260 may overlap the fourth active pattern AP4 in the third direction D3.

In an implementation, at least a part of the bottom side 160B S of the first gate separation structure 160 may overlap at least a part of the first lower pattern BP1 in the third direction D3. At least a part of the bottom side 260BS of the second gate separation structure 260 may overlap at least a part of the fourth lower pattern BP4 in the third direction D3.

At least a part of the bottom side 160B S of the second portion 160_2 of the first gate separation structure 160 may overlap the first lower pattern BP1 in the third direction D3. At least a part of the bottom side 260BS of the second portion 260_2 of the second gate separation structure 260 may overlap the fourth lower pattern BP4 in the third direction D3.

A side wall 160SW of the second portion 160_2 of the first gate separation structure 160 may be spaced apart from (e.g., at least a portion of) the gate insulating film 130. The gate electrode 120 may be between the side wall 160SW of the second portion 160_2 of the first gate separation structure 160 and (e.g., at least a portion of) the gate insulating film 130. A side wall 260SW of the second portion 260_2 of the second gate separating structure 260 may be spaced apart from (e.g., at least a portion of) the gate insulating film 130. The gate electrode 120 may be between the side wall 260SW of the second portion 260_2 of the second gate separation structure 260 and (e.g., at least a portion of) the gate insulating film 130.

In FIG. 3, the bottom side 160BS of the first gate separation structure 160 may not overlap the first active pattern AP1 and the second active pattern AP2 in the third direction D3. The bottom side 260BS of the second gate separation structure 260 may not overlap the third active pattern AP3 and the fourth active pattern AP4 in the third direction D3.

In an implementation, the bottom side 160BS of the first portion 160_1 of the first gate separation structure 160 may not overlap the first lower pattern BP1 and the second lower pattern BP2 in the third direction D3. In an implementation, the bottom side 260BS of the first portion 260_1 of the second gate separation structure 260 may not overlap the third lower pattern BP3 and the fourth lower pattern BP4 in the third direction D3.

In an implementation, the bottom side 160BS of the first gate separation structure 160 may be lower (e.g., closer to the substrate 100 in the third direction D3) than an upper side of the field insulating film 105. At least a part of the first gate separation structure 160 may overlap the field insulating film 105 in the second direction D2.

In an implementation, the bottom side 160BS of the first gate separation structure 160 and the bottom side 260B S of the second gate separation structure 260 may be higher (e.g., farther from the substrate 100) than a bottom side 170B S of the first element separation structure 170. In an implementation, on the basis of the upper side 150US of the gate capping pattern 150, the bottom side 160BS of the first gate separation structure 160 and the bottom side 260BS of the second gate separation structure 260 may be lower than the bottom side 170B S of the first element separation structure 170.

In an implementation, a plane of the bottom side 105BS of the field insulating film 105 may be between a plane of the bottom side 170B S of the first element separation structure 170 and a plane of the bottom side 160B S of the first gate separation structure 160. The plane of the bottom side 105B S of the field insulating film 105 may be between the plane of the bottom side 170B S of the first element separation structure 170 and a plane of the bottom side 260BS of the second gate separation structure 260.

In an implementation, a height from the upper side 160US of the first gate separation structure 160 to the bottom side 160B S of the first gate separation structure 160, and a height from the upper side 260US of the second gate separation structure 260 to the bottom side 260BS of the second gate separation structure 260 may be smaller than a height from the upper side 170US of the first element separation structure 170 to the bottom side 170BS of the first element separation structure 170 (e.g., as measured in the third direction D3).

The first gate separation structure 160 and the second gate separation structure 260 may each include, e.g., silicon nitride (SiN), silicon oxide ($SiO_2$), or a combined film thereof. In an implementation, the first gate separation structure 160 and the second gate separation structure 260 may be a single film. In an implementation, the first gate separation structure 160 and the second gate separation structure 260 may be multiple-films (e.g., multilayer films).

The first element separation structure 170, the second element separation structure 270, and the third element separation structure 370 may extend (e.g., lengthwise) in the second direction D2. The first element separation structure 170, the second element separation structure 270, and the third element separation structure 370 may each include a long side extending in the second direction D2 and a short side extending in the first direction D1.

The first element separation structure 170 may completely separate the second active pattern AP2 and the third active pattern AP3 into two parts. The second element separation structure 270 may completely separate the first active pattern AP1 into two parts. The third element separation structure 370 may completely separate the fourth active pattern AP4 into two parts.

In FIG. 1, when an element separation structure is formed between the first portion 160_1 of the first gate separation structure 160 and the first portion 260_1 of the second gate separation structure 260, the element separation structure may not completely separate the second active pattern AP2 and the third active pattern AP3.

In an implementation, as shown in FIGS. 1 and 2, when the first element separation structure 170 is between the second portion 160_2 of the first gate separation structure 160 and the second portion 260_2 of the second gate separation structure 260, the first element separation structure 170 may completely separate the second active pattern AP2 and the third active pattern AP3. The second portion 160_2 of the first gate separation structure 160 may be close to the first active pattern AP1, and the second portion 260_2 of the second gate separation structure 260 may be close to the fourth active pattern AP4. Accordingly, a distance between the second portion 160_2 of the first gate separation structure 160 and the second portion 260_2 of the second gate separation structure 260 may increase. In an implementation, the length of the first element separation structure 170 in the second direction D2 may increase. Accordingly, the first element separation structure 170 may completely separate the second active pattern AP2 and the third active pattern AP3.

In an implementation, the side wall of the first element separation structure 170 may not penetrate the second active pattern AP2 and the third active pattern AP3. A part of the side wall of the first element separation structure 170 may extend from the bottom side 105BS of the field insulating film 105 to the upper side of the field insulating film 105.

The first element separation structure 170 may be between the first gate separation structure 160 and the second gate separation structure 260. In an implementation, the first element separation structure 170 may be between the second portion 160_2 of the first gate separation structure 160 and the second portion 160_2 of the second gate separation structure 260.

The first element separation structure 170 may overlap the second portion 160_2 of the first gate separation structure 160 and the second portion 260_2 of the second gate separation structure 260 in the second direction D2.

In an implementation, the length of the first element separation structure 170 in the second direction D2 may be greater than the distance between the first portion 160_1 of the first gate separation structure 160 and the first portion 260_1 of the second gate separation structure 260. In an implementation, the length of the first element separation structure 170 in the second direction D2 may be greater than the distance between the first side 160a of the first portion 160_1 of the first gate separation structure 160 and the fourth side 260b of the first portion 260_1 of the second gate separation structure 260.

At least a part of the first element separation structure 170 may overlap the first gate separation structure 160 in the first direction D1. In an implementation, at least a part of the first element separation structure 170 may overlap the first portion 160_1 of the first gate separation structure 160 in the first direction D1.

The second portion 160_2 of the first gate separation structure 160 may be closer to the first active pattern AP1 than it is to the second active pattern AP2. The second portion 260_2 of the second gate separation structure 260 may be closer to the fourth active pattern AP4 than to the third active pattern AP3. In an implementation, the first element separation structure 170 may completely separate the second active pattern AP2 and the third active pattern AP3 into two parts.

The third portion 160_3 of the first gate separation structure 160 may be closer to the second active pattern AP2 than it is to the first active pattern AP1. In an implementation, the second element separation structure 270 may completely separate the first active pattern AP1 into two parts.

The third portion 260_3 of the second gate separation structure 260 may be closer to the third active pattern AP3 than it is to the fourth active pattern AP4. Accordingly, the third element separation structure 370 may completely separate the fourth active pattern AP4 into two parts.

The second element separation structure 270 and the third element separation structure 370 may overlap each other or be aligned in the second direction D2. The second element separation structure 270 and the third element separation structure 370 may overlap the third portion 160_3 of the first gate separation structure 160 and the third portion 260_3 of the second gate separation structure 260 in the second direction D2.

In an implementation, as illustrated in FIG. 2, the bottom side 170BS of the first element separation structure 170 may be lower than the bottom side 105BS of the field insulating film 105. The bottom side 105BS of the field insulating film 105 may be between the bottom side 170BS of the first element separation structure 170 and the bottom side 160BS of the first gate separation structure 160. In an implementation, the first element separation structure 170 may completely separate the second active pattern AP2 and the third active pattern AP3.

In an implementation, as illustrated in FIGS. 4A and 4B, the first element separation structure 170 may contact a source/drain pattern 180.

In the process of forming the first element separation structure 170, a part of the source/drain pattern 180 may be exposed when the gate electrode 120 is removed. The first element separation structure 170 may fill the exposed portion of the source/drain pattern 180.

In an implementation, a dummy second sheet pattern UP2_R may be between (e.g., a part of) the first element separation structure 170 and the source/drain pattern 180. The dummy second sheet pattern UP2_R may be a portion in which the second sheet pattern UP2 remains without being removed in the process of forming the first element separation structure 170.

In an implementation, as illustrated in FIGS. 4A to 6, the upper side 170US of the first element separation structure 170 may be on the same plane as the upper side 160US of the first gate separation structure 160, the upper side 150US of the gate capping pattern 150, the upper side 185US of the first interlayer insulating film 185, and the upper side 260US of the second gate separation structure 260.

The first element separation structure 170, the second element separation structure 270, and the third element separation structure 370 may each include silicon nitride (SiN), silicon oxide ($SiO_2$), or a combined film thereof. In an implementation, the first element separation structure 170 may be a single film. In an implementation, first element separation structure 170 may be formed of multiple-films.

The source/drain pattern 180 may be on the first to fourth lower patterns BP1 to BP4. The source/drain pattern 180 may be between the gate structures GS. The source/drain pattern 180 may be on the side wall of the gate structure GS. The source/drain pattern 180 may be between adjacent gate structures GS.

In an implementation, the source/drain pattern 180 may be on either side of the gate structure GS. In an implementation, the source/drain pattern 180 may be on one side of the gate structure GS and may not be on the other side of the gate structure GS.

The source/drain pattern 180 may include an epitaxial pattern. The source/drain pattern 180 may be included in a source/drain region of a transistor that uses the first to fourth sheet patterns UP1 to UP4 as a channel region.

In an implementation, as illustrated in FIG. 4B, the semiconductor device may further include an etching stop film 165.

The etching stop film 165 may be on the upper side of the source/drain pattern 180 and the side walls of the gate structure GS. In an implementation, the etching stop film 165 may be along the side walls of the source/drain pattern 180 and the upper side of the field insulating film 105. The etching stop film 165 may include, e.g., a material having an etching selectivity with respect to the first interlayer insulating film 185. The etching stop film 165 may include, e.g., silicon nitride (SiN), silicon oxynitride (SiON), silicon oxycarbonitride (SiOCN), silicon boronitride (SiBN), silicon oxyboronitride (SiOBN), silicon oxycarbide (SiOC), or combinations thereof.

In an implementation, as shown in FIG. 4A, the etching stop film 165 may be omitted. Hereinafter, the description will be made on the basis of a case where the etching stop film 165 is not formed.

The first interlayer insulating film 185 may be on the source/drain pattern 180 and the field insulating film 105. The first interlayer insulating film 185 may be between the adjacent gate structure GS. The upper side 185 US of the first interlayer insulating film 185 may be on the same plane as the upper side 150 US of the gate capping pattern 150, the upper side 170US of the first element separation structure 170, the upper side 160US of the first gate separation structure 160, and the upper side 260US of the second gate separation structure 260.

The first interlayer insulating film 185 may include, e.g., silicon oxide, silicon nitride, silicon oxynitride, or a low dielectric constant material. The low dielectric constant material may include, e.g., Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethylCycloTetraSiloxane (oMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or combinations thereof.

In an implementation, the semiconductor device may further include a gate contact and an active contact. The gate contact may be at a position where it overlaps the gate structure GS in the third direction D3. The gate contact may penetrate the gate capping pattern 150 in the third direction D3 and be connected to the gate electrode 120.

The active contact may be at a position where it overlaps the source/drain pattern 180. The active contact may penetrate the first interlayer insulating film 185 in the third direction D3 and be connected to the source/drain pattern 180.

The second interlayer insulating film 190 may be on the first interlayer insulating film 185. The second interlayer insulating film 190 may be on the gate capping pattern 150, the first gate separation structure 160, the first element separation structure 170, and the second gate separation structure 260. The second interlayer insulating film 190 may cover the first interlayer insulating film 185, the gate capping pattern 150, the first gate separation structure 160, the first element separation structure 170, and the second gate separation structure 260.

The second interlayer insulating film 190 may include, e.g., silicon oxide, silicon nitride, silicon oxynitride, or a low dielectric constant material.

In an implementation, a wiring pattern 195 may be inside the second interlayer insulating film 190. In an implementation, the wiring pattern 195 may be connected to the gate contact and be connected to the gate electrode 120.

The wiring pattern 195 may have a multiple conductive film structure. The wiring pattern 195 may include, e.g., a wiring barrier film 195a and a wiring filling film 195b. The wiring filling film 195b may be on the wiring barrier film 195a. The wiring barrier film 195a may be along the side walls and bottom side of the wiring filling film 195b.

The wiring barrier film 195a may include, e.g., tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material.

The wiring filling film 195b may include, e.g., aluminum (Al), copper (Cu), tungsten (W), cobalt (Co), ruthenium (Ru), silver (Ag), gold (Au), manganese (Mn), or molybdenum (Mo).

Figure 7:
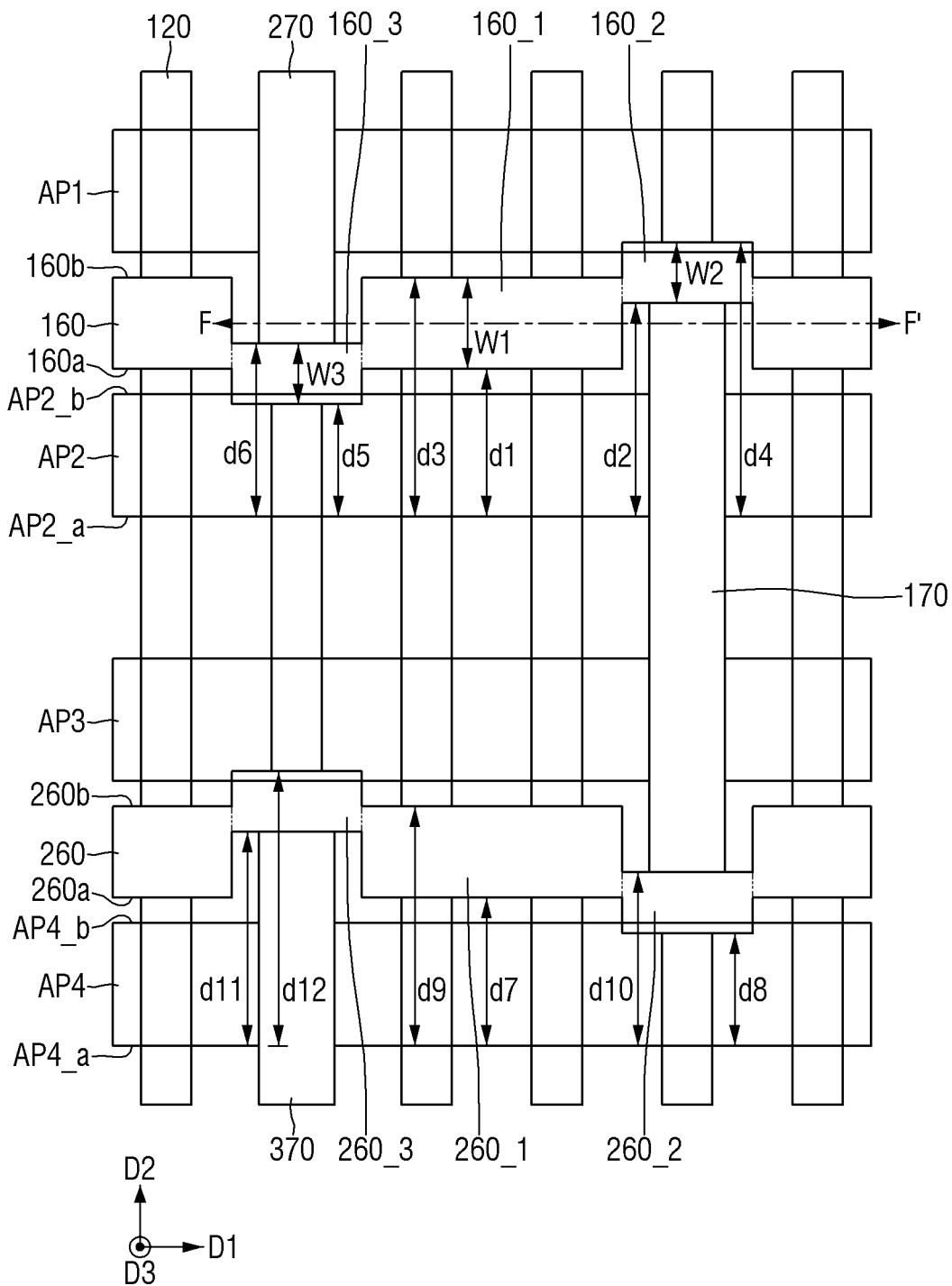
FIG. 7 is a diagram of the semiconductor device according to some embodiments.
Figure 8:
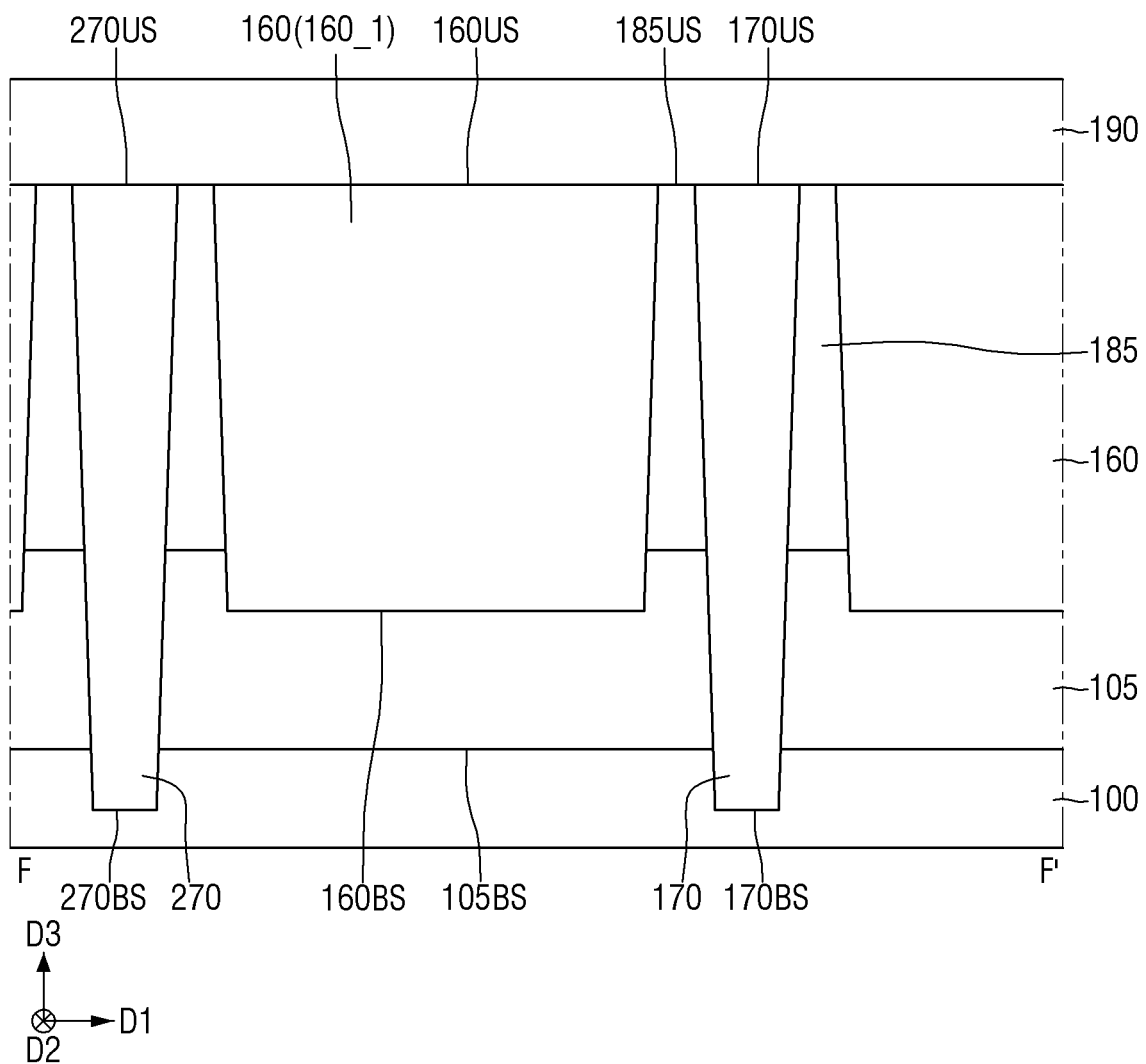
FIG. 8 is a cross-sectional view taken along F-F' of FIG. 7.

FIG. 7 is a diagram of the semiconductor device according to some embodiments. FIG. 8 is a cross-sectional view taken along F-F' of FIG. 7. For convenience of explanation, points different from those described using FIGS. 1 to 6 may be mainly described.

Referring to FIG. 7, the width W1 of the first portion 160_1 of the first gate separation structure 160 in the second direction D2 may be greater than the width W2 of the second portion 160_2 of the first gate separation structure 160 in the second direction D2.

The width W1 of the first portion 160_1 of the first gate separation structure 160 in the second direction D2 may be greater than the width W3 of the third portion 160_3 of the first gate separation structure 160 in the second direction D2.

The second portion 160_2 of the first gate separation structure 160 is a portion that overlaps the first element separation structure 170 in the second direction D2. The width W2 of the second portion 160_2 of the first gate separation structure 160 in the second direction D2 may narrow, and when the first element separation structure 170 is formed, the risk of the second active pattern AP2 not being completely separated may be significantly reduced.

Similarly, the third portion 160_3 of the first gate separation structure 160 is a portion that overlaps the second element separation structure 270 in the second direction D2. The width W3 of the third portion 160_3 of the first gate separation structure 160 in the second direction D2 may narrow, and when the second element separation structure 270 is formed, the risk of the first active pattern AP1 not being completely separated can be significantly reduced.

In an implementation, the distance d2 from the second active pattern AP2 to the first side 160*a* of the second portion 160_2 of the first gate separation structure 160 may be greater than the distance d6 from the second active pattern AP2 to the second side 160*b* of the third portion 160_3 of the first gate separation structure 160. In an implementation, at least a part of the first element separation structure 170 may overlap the second element separation structure 270 in the first direction D1.

The distance d10 from the fourth active pattern AP4 to the fourth side 260*b* of the second portion 260_2 of the second gate separation structure 260 may be smaller than a distance d11 from the fourth active pattern AP4 to the third side 260*a* of the second gate separation structure 260. In an implementation, at least a part of the third element separation structure 370 may overlap the first element separation structure 170 in the first direction D1.

Referring to FIG. 8, at least a part of the first element separation structure 170 may overlap the second element separation structure 270 in the first direction D1.

The first element separation structure 170 may be spaced apart from the second element separation structure 270 in the first direction D1. The first interlayer insulating film 185 and the first gate separation structure 160 may be between the first element separation structure 170 and the second element separation structure 270. The first portion 160_1 of the first gate separation structure 160 may be between the first element separation structure 170 and the second element separation structure 270.

The bottom side 170B S of the first element separation structure 170 may be on the same plane as the bottom side 270BS of the second element separation structure 270. The upper side 170US of the first element separation structure 170 may be on the same plane as the upper side 270US of the second element separation structure 270.

Figure 9:
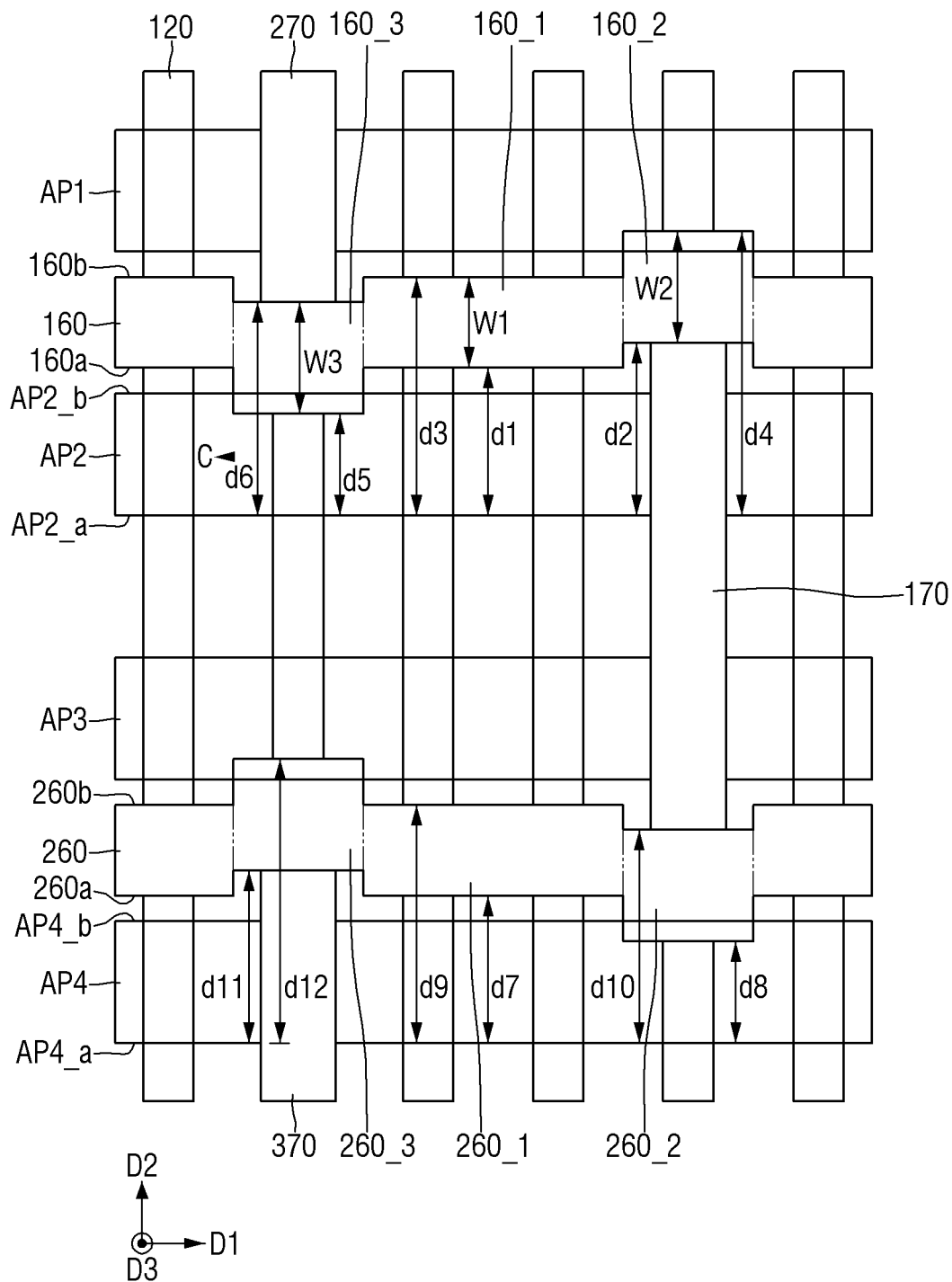
FIG. 9 is a diagram of a semiconductor device according to some embodiments.

FIG. 9 is a diagram of a semiconductor device according to some embodiments. For convenience of explanation, points different from those described using FIGS. 1 to 6 will be mainly described. For reference, FIG. 9 may be an exemplary layout diagram of a semiconductor device according to some embodiments.

Referring to FIG. 9, the width W1 of the first portion 160_1 of the first gate separation structure 160 in the second direction D2 may be smaller than the width W2 of the second portion 160_2 of the first gate separation structure 160 in the second direction D2.

Figure 10:
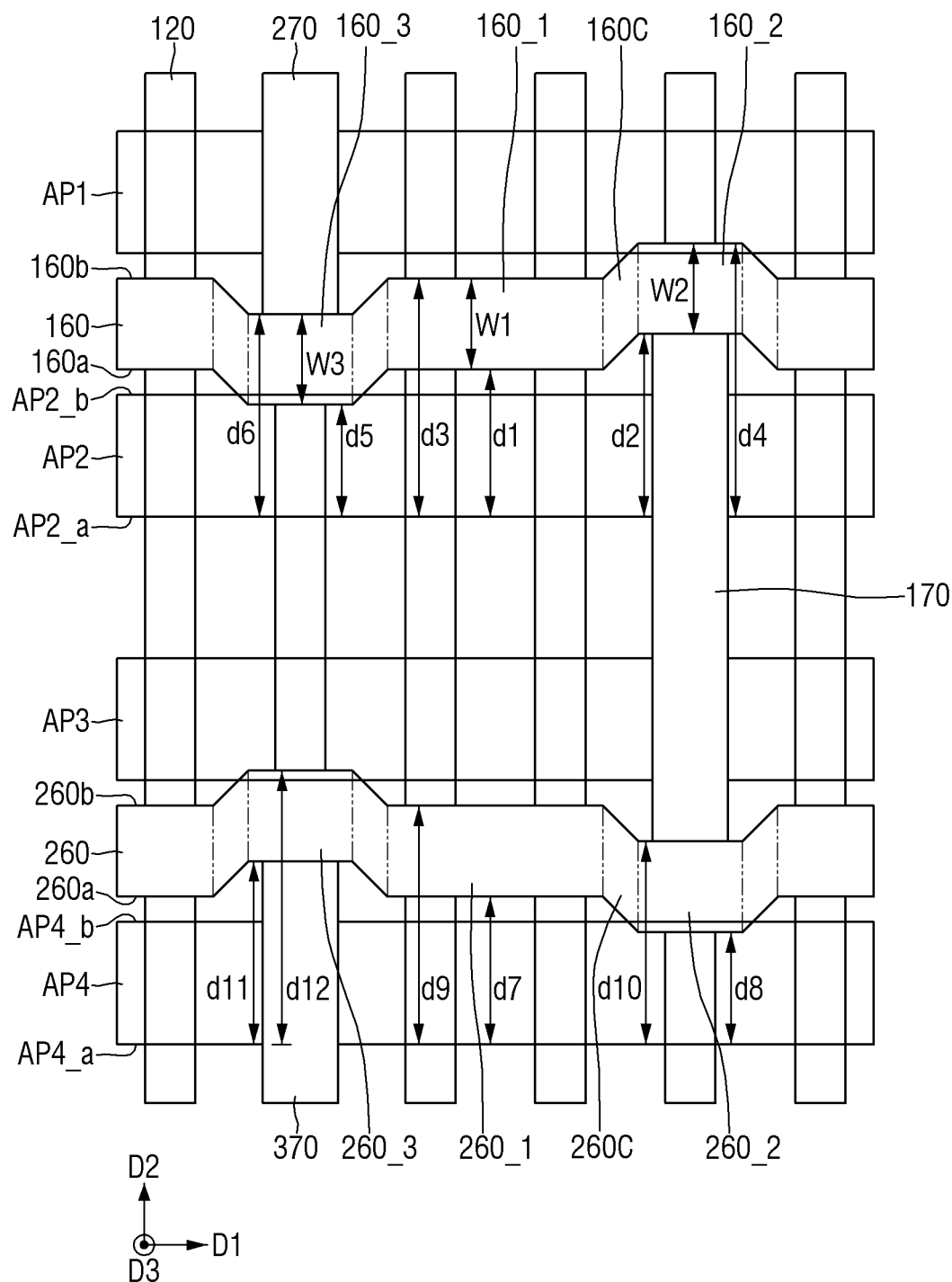
FIG. 10 is a diagram of the semiconductor device according to some embodiments.

FIG. 10 is a diagram of the semiconductor device according to some embodiments. For convenience of explanation, points different from those described using FIGS. 1 to 6 will be mainly described. For reference, FIG. 10 may be an exemplary layout diagram of the semiconductor device according to some embodiments.

Referring to FIG. 10, the first gate separation structure 160 may include a first connecting portion 160C.

The second gate separation structure 260 may include a second connecting portion 260C. The description of the second connecting portion 260C is substantially the same as the description of the first connecting portion 160C, and only the first connecting portion 160C will be described below.

The first connecting portion 160C may connect the first portion 160_1 and the second portion 160_2 of the first gate separation structure 160. The first connecting portion 160C may connect the first portion 160_1 and the third portion 160_3 of the first gate separation structure 160.

The first side 160*a* of the first connecting portion 160C may connect the first side 160*a* of the first portion 160_1 and the first side 160*a* of the second portion 160_2. The first side 160*a* of the first connecting portion 160C may connect the first side 160*a* of the first portion 160_1 and the first side 160*a* of the third portion 160_3. The second side 160*b* of the first connecting portion 160C may connect the second side 160*b* of the first portion 160_1 and the second side 160*b* of the second portion 160_2. The second side 160*b* of the first connecting portion 160C may connect the second side 160*b* of the first portion 160_1 and the second side 160*b* of the third portion 160_3.

In an implementation, the width of the first connecting portion 160C in the second direction D2 may be constant. A distance between the first side 160*a* and the second side 160*b* of the first connecting portion 160C may be constant.

In an implementation, the first side 160*a* of the first connecting portion 160C and the second side 160*b* of the first connecting portion 160C may be a straight line. In an implementation, the first side 160*a* of the first connecting portion 160C and the second side 160*b* of the first connecting portion 160C may be a curved line.

Figure 11:
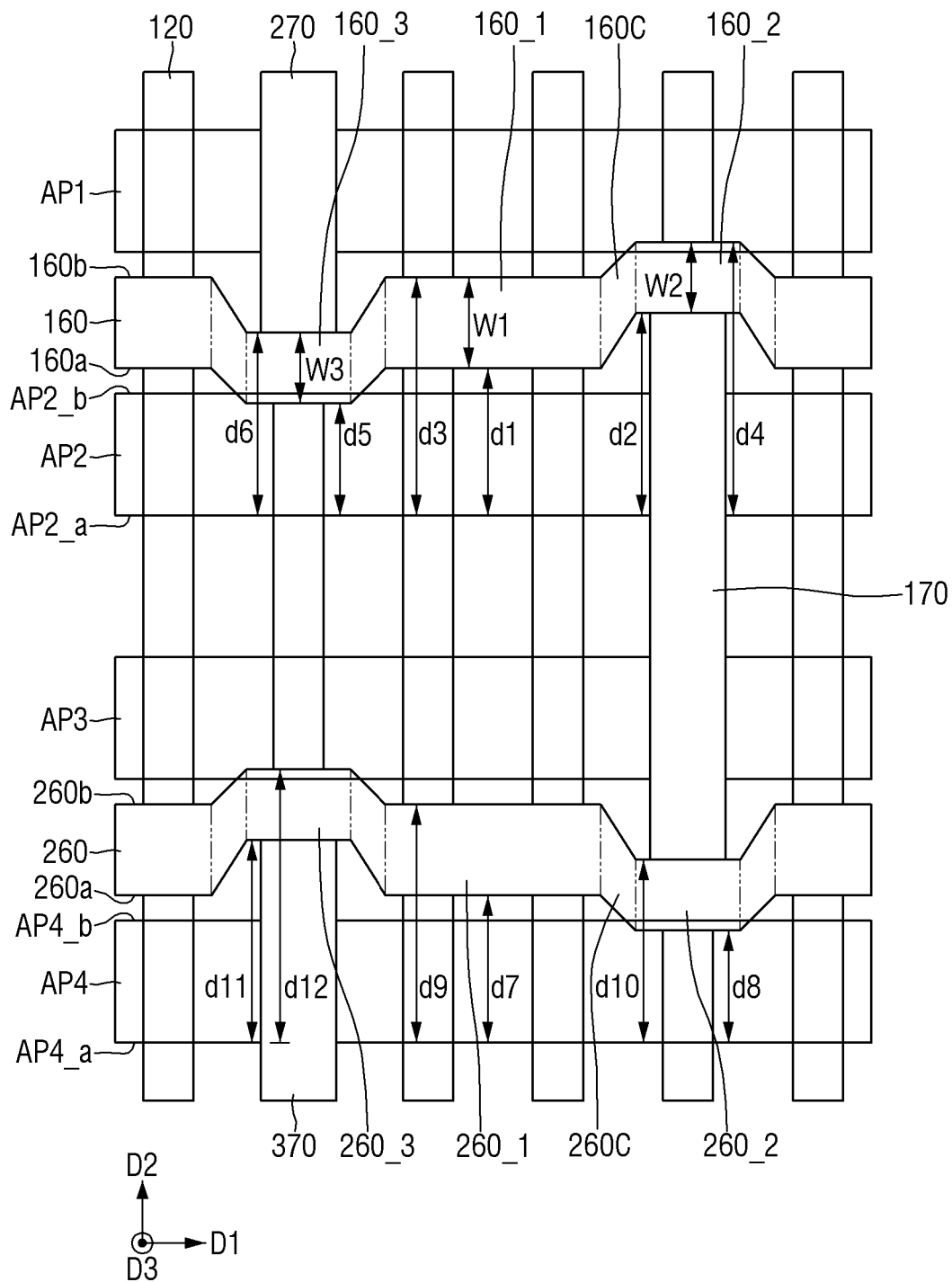
FIG. 11 is a diagram of a semiconductor device according to some embodiments.

FIG. 11 is a diagram of a semiconductor device according to some embodiments. For convenience of explanation, points different from those described using FIGS. 1 to 6 and 10 will be mainly described. For reference, FIG. 11 may be an exemplary layout diagram of a semiconductor device according to some embodiments.

Referring to FIG. 11, the width of the first connecting portion 160C of the first gate separation structure 160 in the second direction D2 may not be constant.

The width of the second connecting portion 260C of the second gate separation structure 260 in the second direction D2 may not be constant. The description of the second connecting portion 260C may be the same as the description of the first connecting portion 160C, and only the first connecting portion 160C will be described below.

In an implementation, the width of the first connecting portion 160C of the first gate separation structure 160 in the second direction D2 may gradually decrease from the first portion 160_1 of the first gate separation structure 160 toward the second portion 160_2 (e.g., along the first direction D1). A distance between the second side 160*b* and the first side 160*a* of the first connecting portion 160C of the first gate separation structure 160 may gradually decrease from the first portion 160_1 of the first gate separation structure 160 toward the second portion 160_2.

The width of the first connecting portion 160C of the first gate separation structure 160 in the second direction D2 may gradually decrease from the first portion 160_1 of the first gate separation structure 160 toward the third portion 160_3. The distance between the second side 160*b* and the first side 160*a* of the first connecting portion 160C of the first gate separation structure 160 may gradually decrease from the first portion 160_1 of the first gate separation structure 160 toward the third portion 160_3.

In an implementation, a width W2 of the second portion 160_2 of the first gate separation structure 160 in the second direction D2 and a width W3 of the third portion 160_3 of the first gate separation structure 160 in the second direction D2 may be smaller than the width W1 of the first portion 160_1 of the first gate separation structure 160 in the second direction D2.

In an implementation, the distance d2 from the second active pattern AP2 to the first side 160a of the second portion 160_2 of the first gate separation structure 160 may be greater than the distance d6 from the second active pattern AP2 to the second side 160b of the third portion 160_3 of the first gate separation structure 160.

Figure 12:
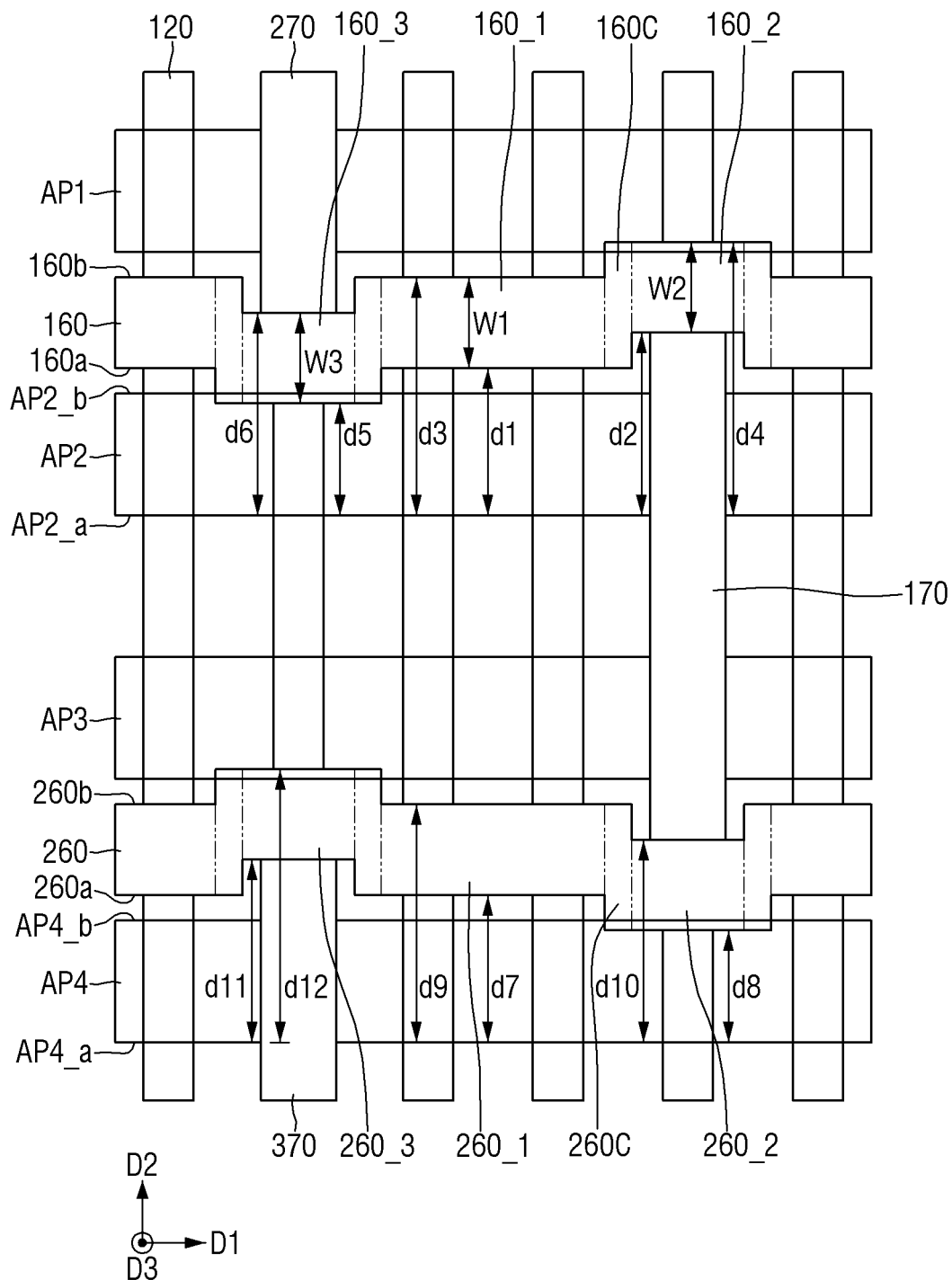
FIG. 12 is a diagram of a semiconductor device according to some embodiments.

FIG. 12 is a diagram of a semiconductor device according to some embodiments. For convenience of explanation, points different from those described using FIGS. 1 to 6, 10 and 11 will be mainly described. For reference, FIG. 12 may be an exemplary layout diagram of a semiconductor device according to some embodiments.

Referring to FIG. 12, the first connecting portion 160C of the first gate separation structure 160 may have a rectangular shape.

The second connecting portion 260C of the second gate separation structure 260 may have a rectangular shape. The description of the second connecting portion 260C may be the same as the description of the first connecting portion 160C, and only the first connecting portion 160C will be described below.

In an implementation, the width of the first connecting portion 160C of the first gate separation structure 160 in the second direction D2 may be the same as the distance from the first side 160a of the first portion 160_1 of the first gate separation structure 160 to the second side 160b of the second portion 160_2 of the first gate separation structure 160, and the distance from the second side 160b of the first portion 160_1 of the first gate separation structure 160 to the first side 160a of the third portion 160_3 of the first gate separation structure 160.

In an implementation, the width of the first connecting portion 160C of the first gate separation structure 160 in the second direction D2 may be greater than (e.g., each of) the width W1 of the first portion 160_1 of the first gate separation structure 160 in the second direction D2, the width W2 of the second portion 160_2 of the first gate separation structure 160 in the second direction D2, and the width W3 of the third portion 160_3 of the first gate separation structure 160 in the second direction D2.

Figure 13:
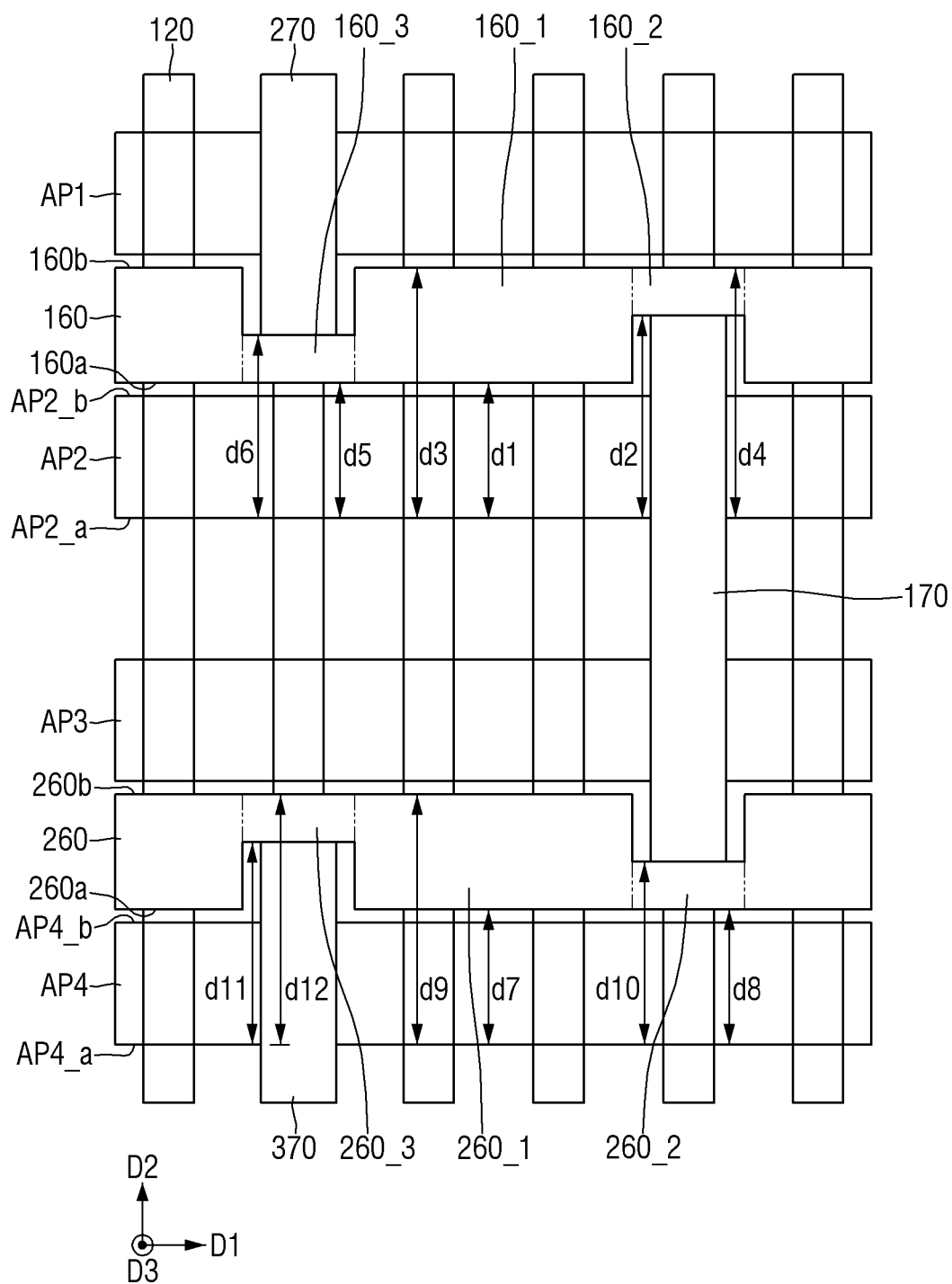
FIG. 13 is a diagram of the semiconductor device according to some embodiments.

FIG. 13 is a diagram of the semiconductor device according to some embodiments. For convenience of explanation, points different from those described using FIGS. 1 to 6 will be mainly described. For reference, FIG. 13 may be an exemplary layout diagram of a semiconductor device according to some embodiments.

Referring to FIG. 13, the second side 160b of the first portion 160_1 of the first gate separation structure 160 may be on the same plane or line as the second side 160b of the second portion 160_2 of the first gate separation structure 160.

In an implementation, the distance d3 from the second active pattern AP2 to the second side 160b of the first portion 160_1 of the first gate separation structure 160 may be the same as the distance d4 from the second active pattern AP2 to the second side 160b of the second portion 160_2 of the first gate separation structure 160.

The first side 160a of the first portion 160_1 of the first gate separation structure 160 may be on the same plane or line as the first side 160a of the third portion 160_3 of the first gate separation structure 160.

In an implementation, the distance d1 from the second active pattern AP2 to the first side 160a of the first portion 160_1 of the first gate separation structure 160 may be the same as the distance d5 from the second active pattern AP2 to the first side 160a of the third portion 160_3 of the first gate separation structure 160.

In an implementation, the third side 260a of the first portion 260_1 of the second gate separation structure 260 may be on the same plane or line as the third side 260a of the second portion 260_2 of the second gate separation structure 260.

In an implementation, the distance d7 from the fourth active pattern AP4 to the third side 260a of the first portion 260_1 of the second gate separation structure 260 may be the same as the distance d8 from the fourth active pattern AP4 to the third side 260a of the second portion 260_2 of the second gate separation structure 260.

The fourth side 260b of the first portion 260_1 of the second gate separation structure 260 may be on the same plane or line as the fourth side 260b of the third portion 260_3 of the second gate separation structure 260.

In an implementation, the distance d9 from the fourth active pattern AP4 to the fourth side 260b of the first portion 260_1 of the second gate separation structure 260 may be the same as the distance d12 from the fourth active pattern AP4 to the fourth side 260b of the third portion 260_3 of the second gate separation structure 260.

Figure 14:
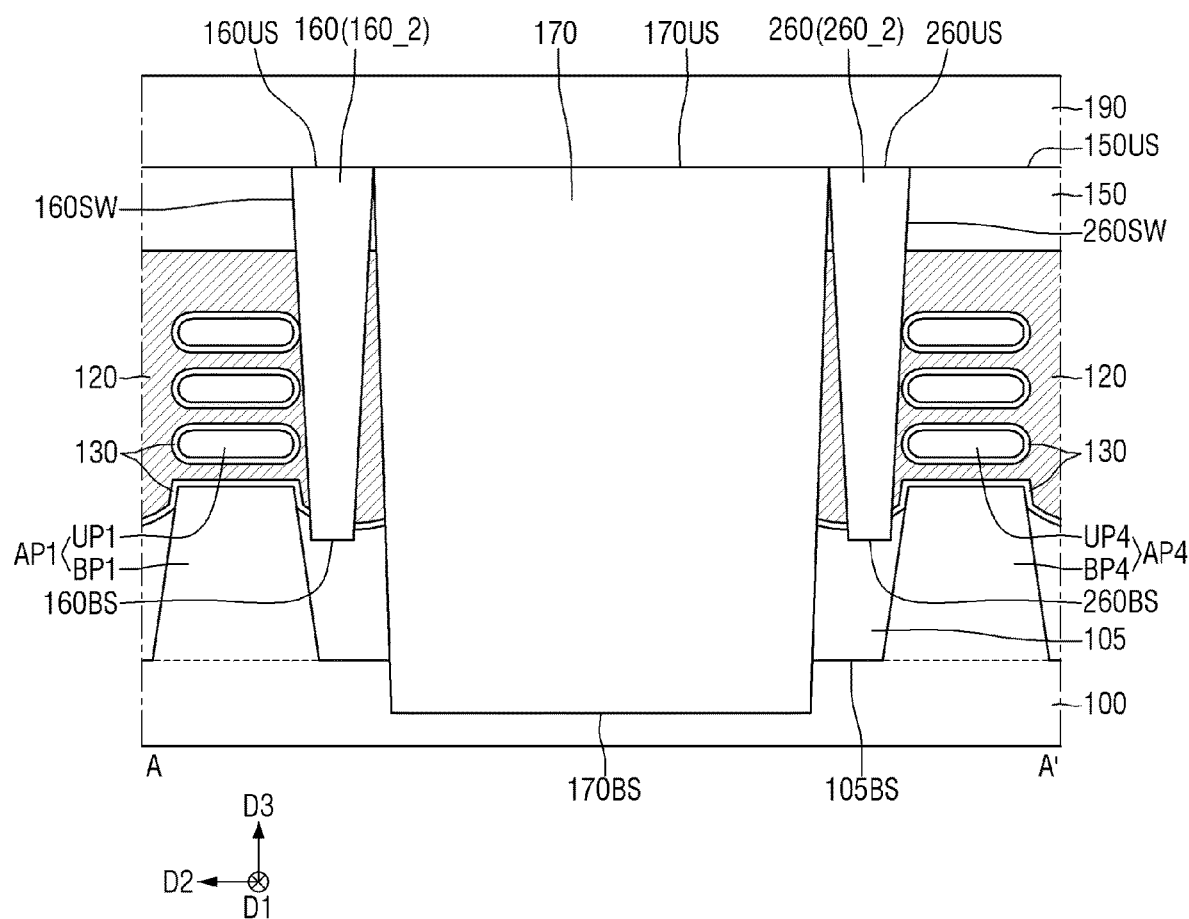
FIG. 14 is a diagram of a semiconductor device according to some embodiments.

FIG. 14 is a diagram of a semiconductor device according to some embodiments. For convenience of explanation, points different from those described using FIGS. 1 to 6 will be mainly described. For reference, FIG. 14 may be a cross-sectional view taken along A-A' of FIG. 1.

Referring to FIG. 14, at least a part of the first gate separating structure 160 may contact the gate insulating film 130. At least a part of the second gate separating structure 260 may contact the gate insulating film 130.

In an implementation, at least a part of the side wall 160SW of the first gate separation structure 160 may contact the gate insulating film 130. In an implementation, the side wall 160SW of the first gate separating structure 160 may penetrate a part of the gate insulating film 130. In this case, the first gate separation structure 160 may not contact the first sheet pattern UP1.

At least a part of the side wall 260SW of the second gate separation structure 260 may contact the gate insulating film 130. In an implementation, the side wall 260SW of the second gate separating structure 260 may penetrate a part of the gate insulating film 130. In an implementation, the second gate separation structure 260 may not contact the fourth sheet pattern UP4.

Figure 15:
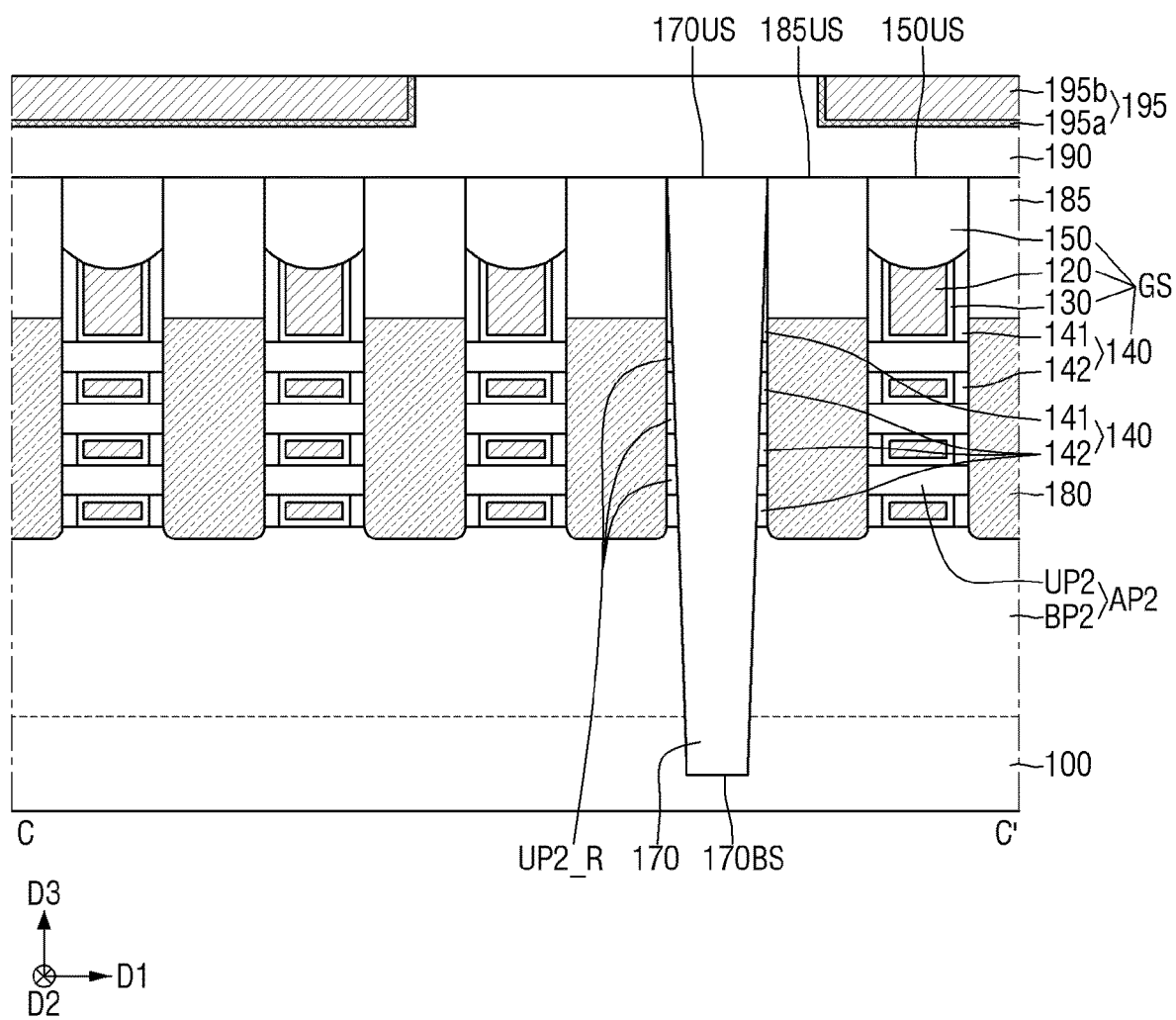
FIG. 15 is a diagram of a semiconductor device according to some embodiments.

FIG. 15 is a diagram of a semiconductor device according to some embodiments. For convenience of explanation, points different from those described using FIGS. 1 to 6 will be mainly described. For reference, FIG. 15 may be a cross-sectional view taken along C-C' of FIG. 1.

Referring to FIG. 15, the gate spacer 140 may include an outer spacer 141 and an inner spacer 142.

The inner spacer 142 may be between (e.g., portions of) the first to fourth sheet patterns UP1 to UP4 that are adjacent to each other in the third direction D3. The inner spacer 142 may be between the source/drain pattern 180 and the gate electrode 120. The inner spacer 142 may be between the first element separation structure 170 and the source/drain pattern 180. In an implementation, the first element separation structure 170 may not contact the source/drain pattern 180.

The outer spacer 141 may be between the first to fourth sheet patterns UP1 to UP4 and the gate capping pattern 150. The outer spacer 141 may be between the source/drain pattern 180 and the gate electrode 120. The outer spacer 141 may be between the first interlayer insulating film 185 and the gate electrode 120.

The outer spacer 141 and the inner spacer 142 may include, e.g., silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), or combinations thereof.

In an implementation, the dummy second sheet pattern UP2_R may be between the inner spacers 142 and between the outer spacer 141 and the inner spacer 142.

Figure 16:
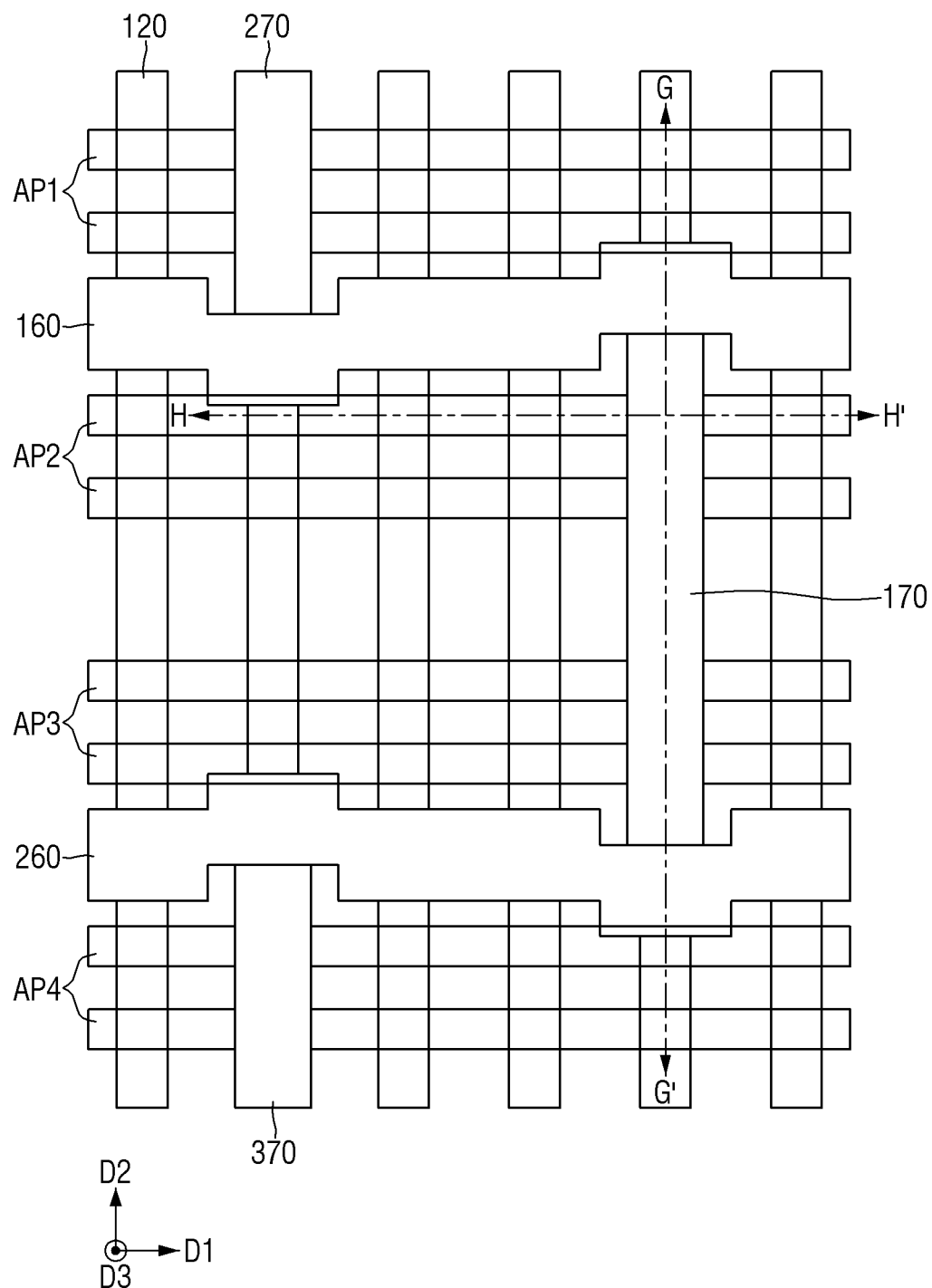
FIG. 16 is a layout view of the semiconductor device according to some embodiments.
Figure 17:
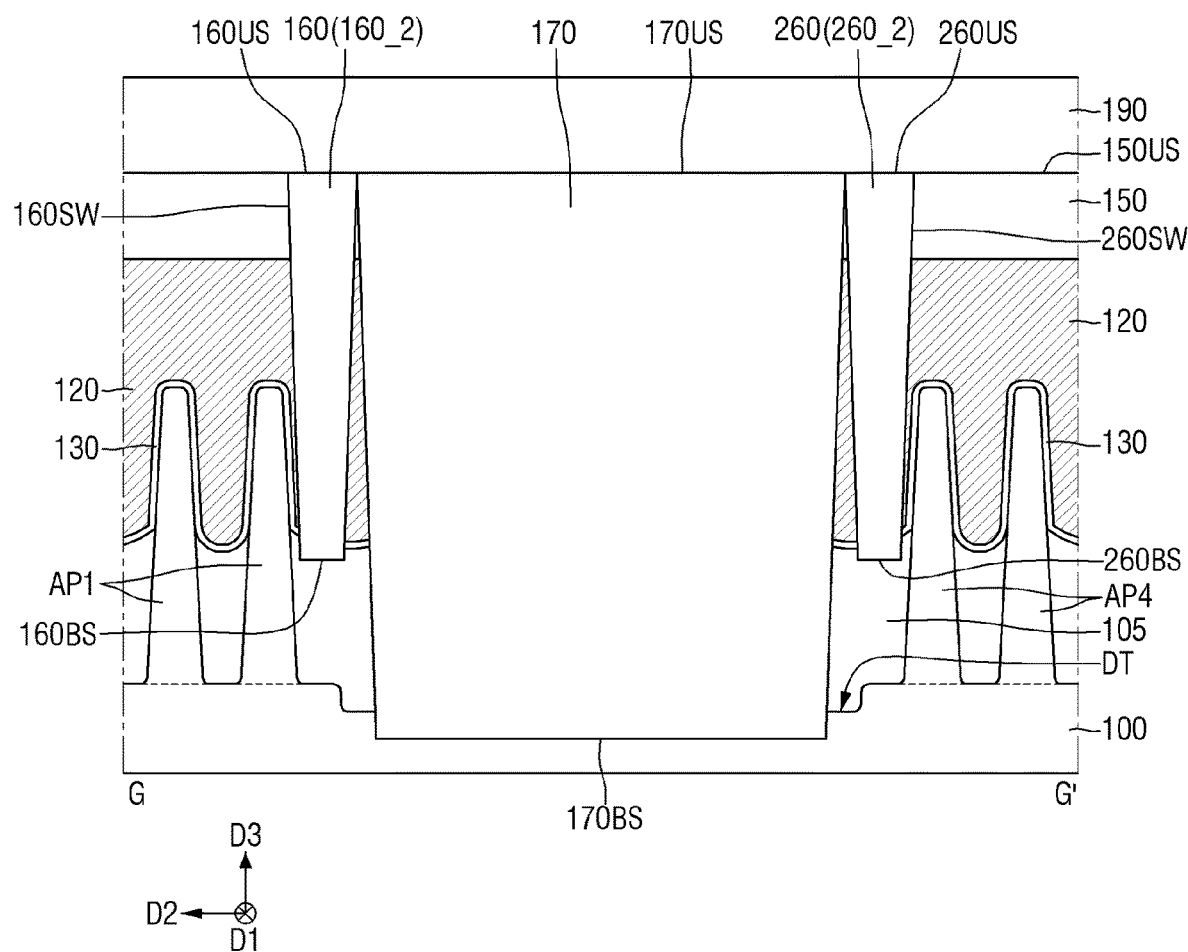
FIG. 17 is a cross-sectional view taken along G-G' of FIG. 16.
Figure 18:
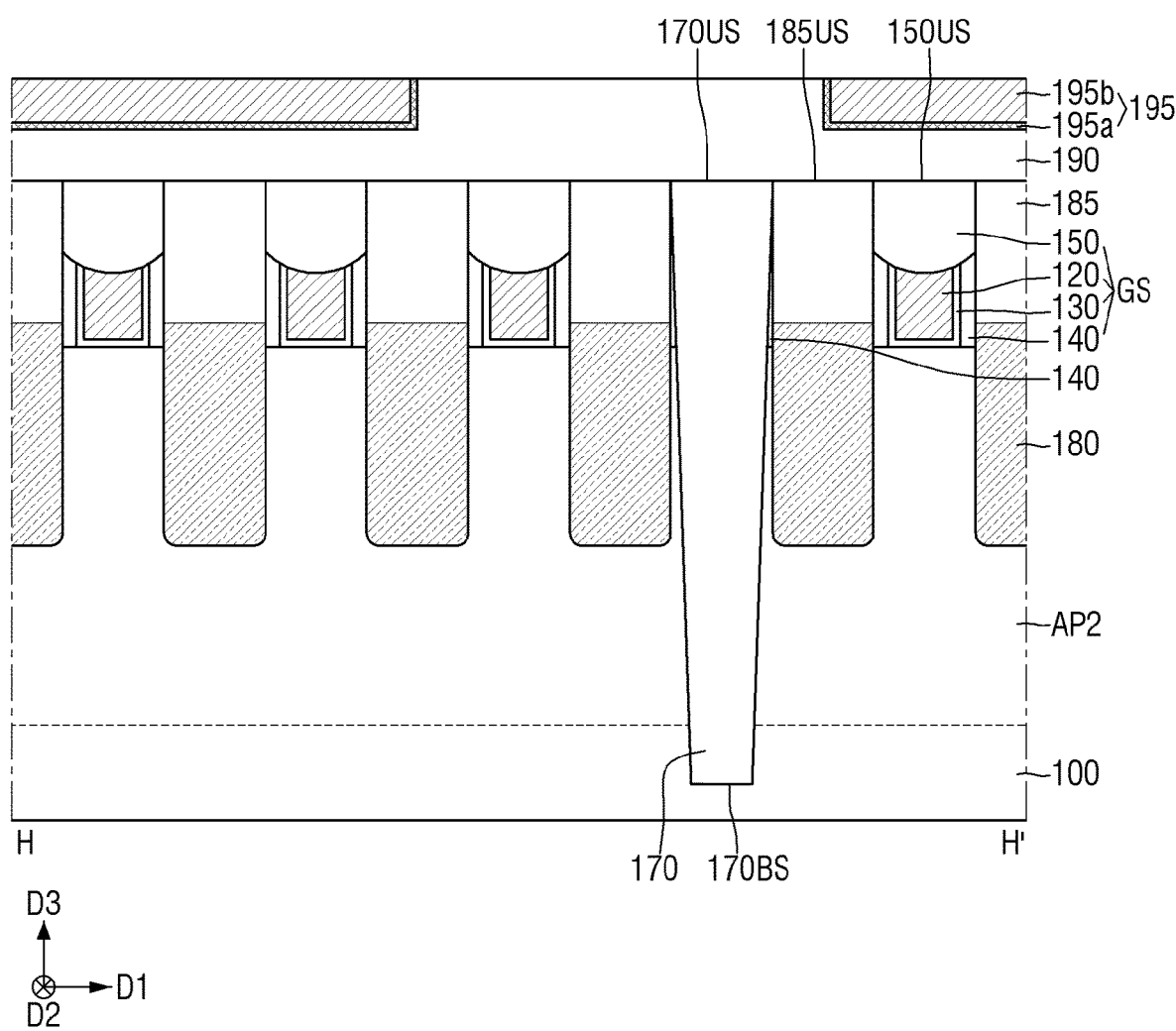
FIG. 18 is a cross-sectional view taken along H-H' of FIG. 16.

FIG. 16 is an exemplary layout diagram of the semiconductor device according to some embodiments. FIG. 17 is an exemplary cross-sectional view taken along G-G' of FIG. 16. FIG. 18 is an exemplary cross-sectional view taken along H-H' of FIG. 16. For convenience of explanation, points different from those described using FIGS. 1 to 6 will be mainly described.

Referring to FIGS. 16 to 18, each of the first to fourth active patterns AP1 to AP4 may be fin-type patterns.

In an implementation, as illustrated in the drawings, two first to fourth active patterns AP1 to AP4 may be included. In an implementation, there may be three first to fourth active patterns AP1 to AP4.

As shown in FIG. 17, the field insulating film 105 may fill a deep trench DT. In an implementation, the field region may be defined by the deep trench DT. In an implementation, a field region may be distinguished from an active region.

In an implementation, as illustrated in FIG. 18, the first element separation structure 170 may be spaced apart from the source/drain pattern 180 in the first direction D1. A second active pattern AP2 may be between the first element separation structure 170 and the source/drain pattern 180.

FIGS. 19 to 30 are stages in a method of fabricating the semiconductor device according to some embodiments.

Hereinafter, a method of fabricating a semiconductor device according to some embodiments will be described referring to FIGS. 19 to 30.

Figure 19:
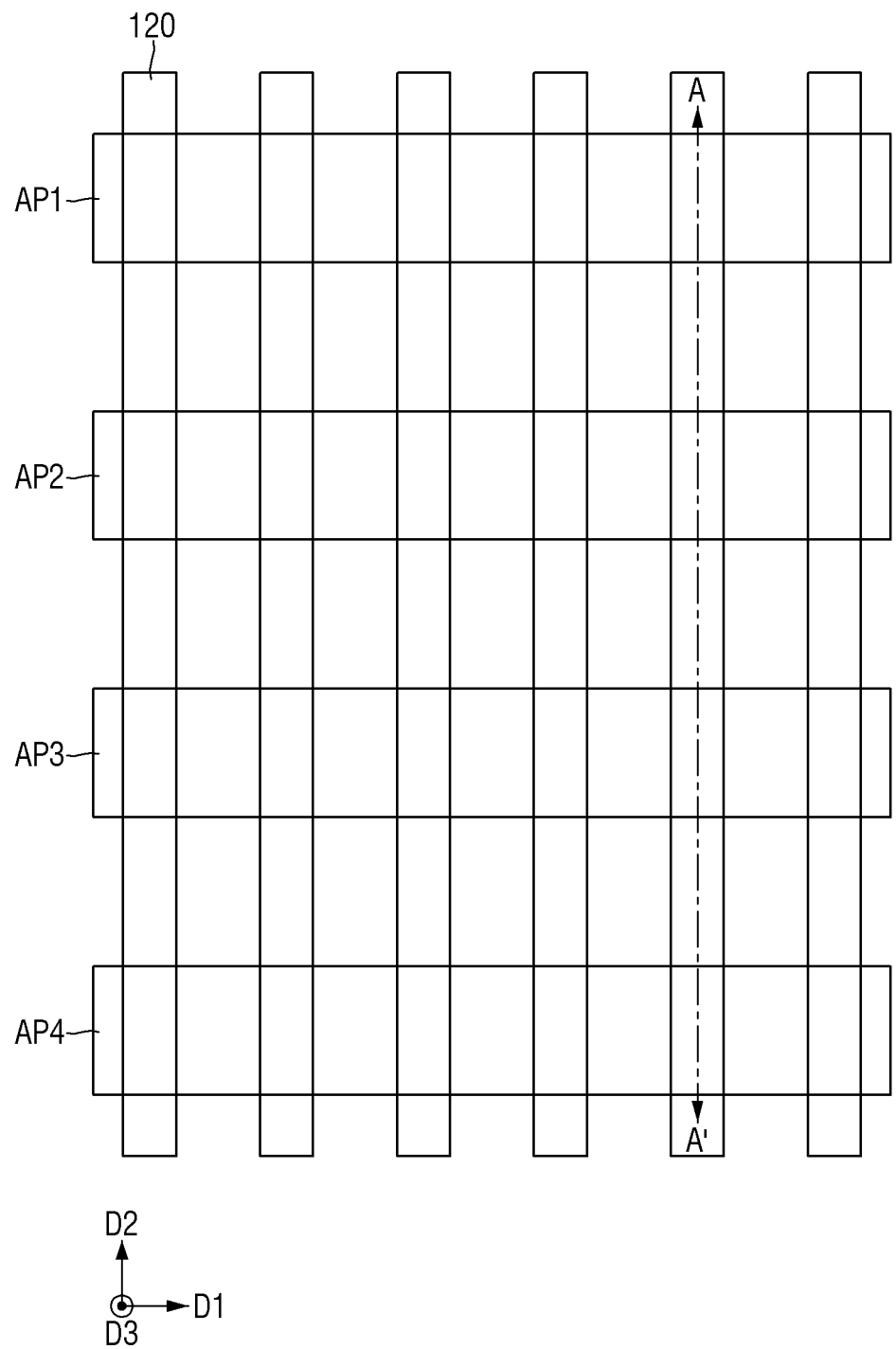
FIGS. 19 to 30 are stages in a method of fabricating the semiconductor device according to some embodiments.
Figure 20:
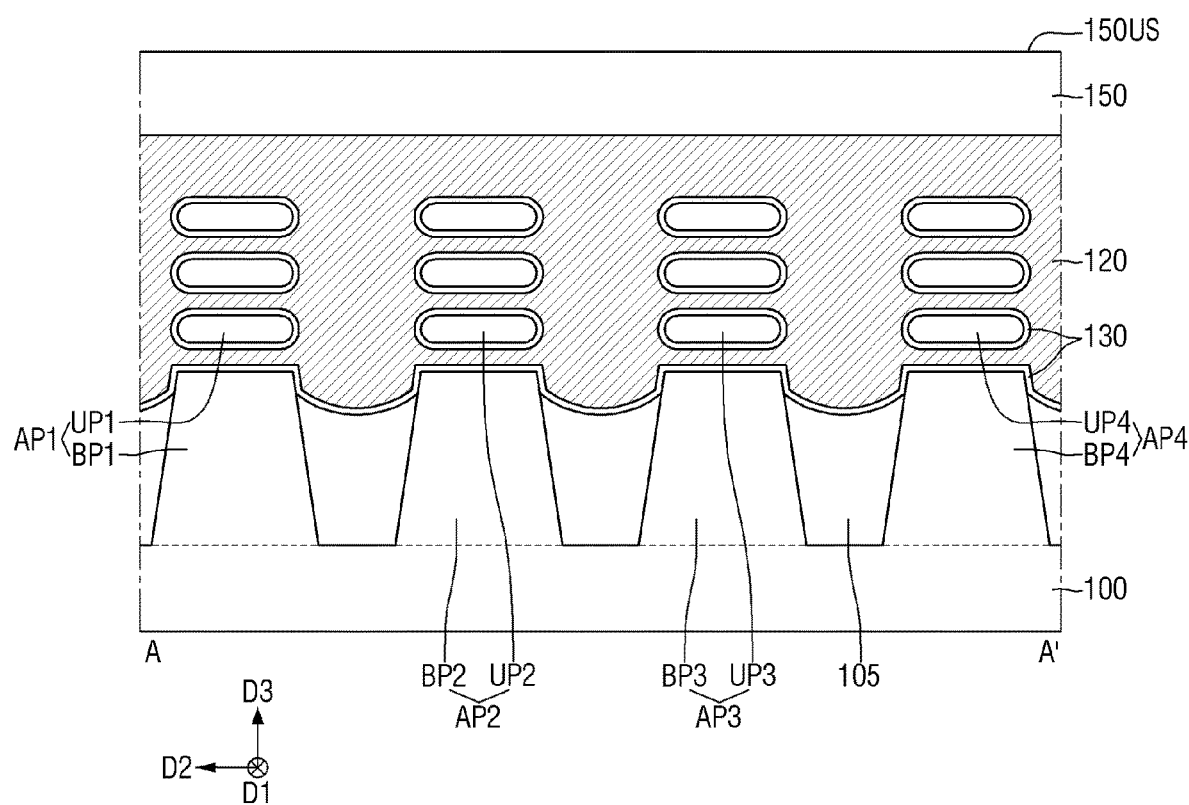

FIG. 19 is a layout diagram of a stage in the method of fabricating the semiconductor device according to some embodiments. FIG. 20 is a cross-sectional view taken along A-A' of FIG. 19.

Referring to FIGS. 19 and 20, the first to fourth active patterns AP1 to AP4 may be formed on the substrate 100.

The first to fourth active patterns AP1 to AP4 may protrude from the substrate 100 in the third direction D3. The first to fourth active patterns AP1 to AP4 may extend (e.g., lengthwise) in the first direction D1. The first to fourth active patterns AP1 to AP4 may be spaced apart from each other in the second direction D2.

The first active pattern AP1 may include a first lower pattern BP1 and a first sheet pattern UP1. The second active pattern AP2 may include a second lower pattern BP2 and a second sheet pattern UP2. The third active pattern AP3 may include a third lower pattern BP3 and a third sheet pattern UP3. The fourth active pattern AP4 may include a fourth lower pattern BP4 and a fourth sheet pattern UP4.

The field insulating film 105 may be between the first to fourth lower patterns BP1 to BP4. The gate insulating film 130 that surrounds the first to fourth sheet patterns UP1 to UP4 may be formed on the field insulating film 105 and the first to fourth lower patterns BP1 to BP4. The gate electrode 120 may be formed on the gate insulating film 130.

The gate electrode 120 may extend in the second direction D2 on the first to fourth active patterns AP1 to AP4. The gate electrode 120 may intersect the first to fourth active patterns AP1 to AP4.

The gate capping pattern 150 may be formed on the gate electrode 120.

Figure 21:
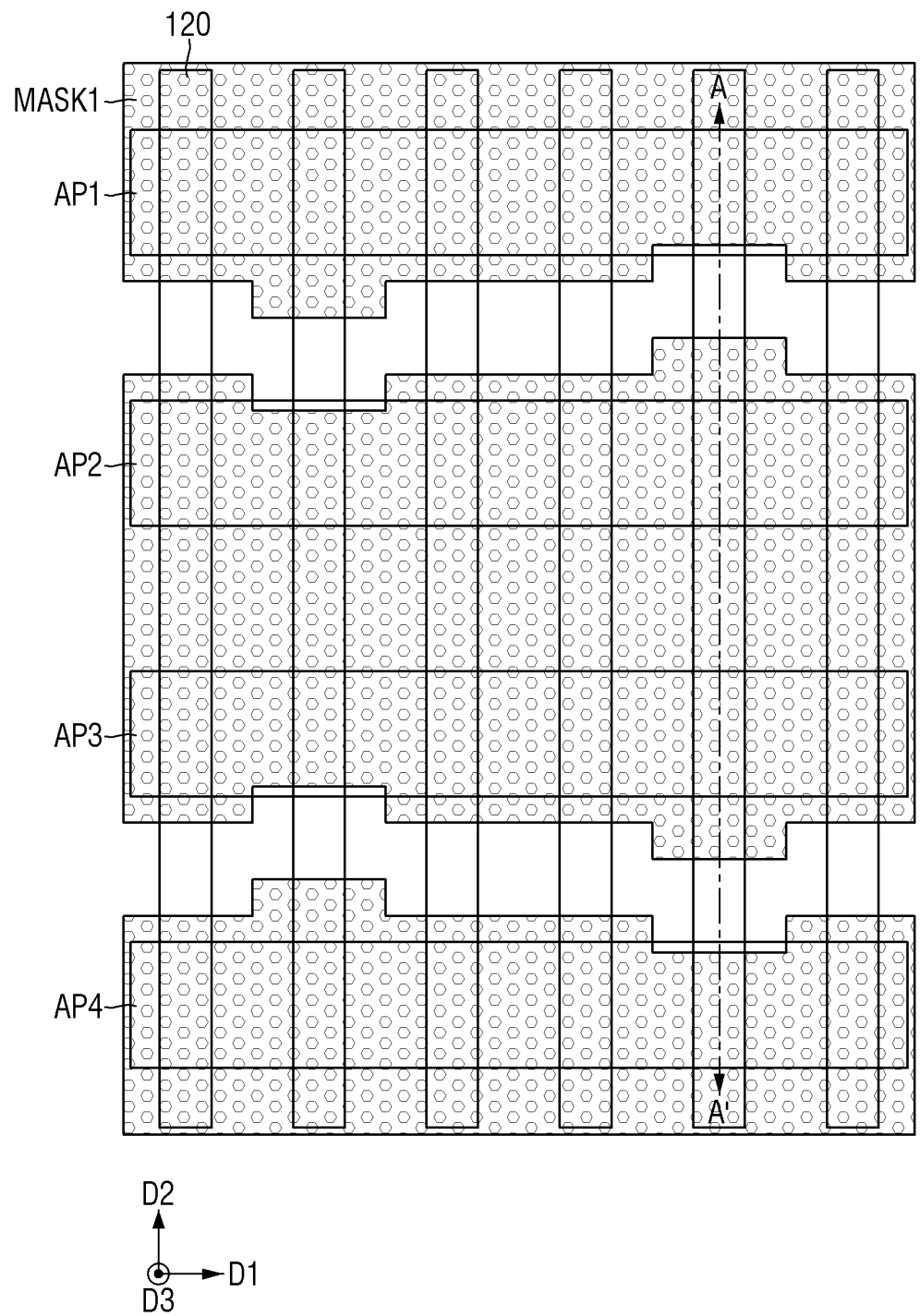
Figure 22:
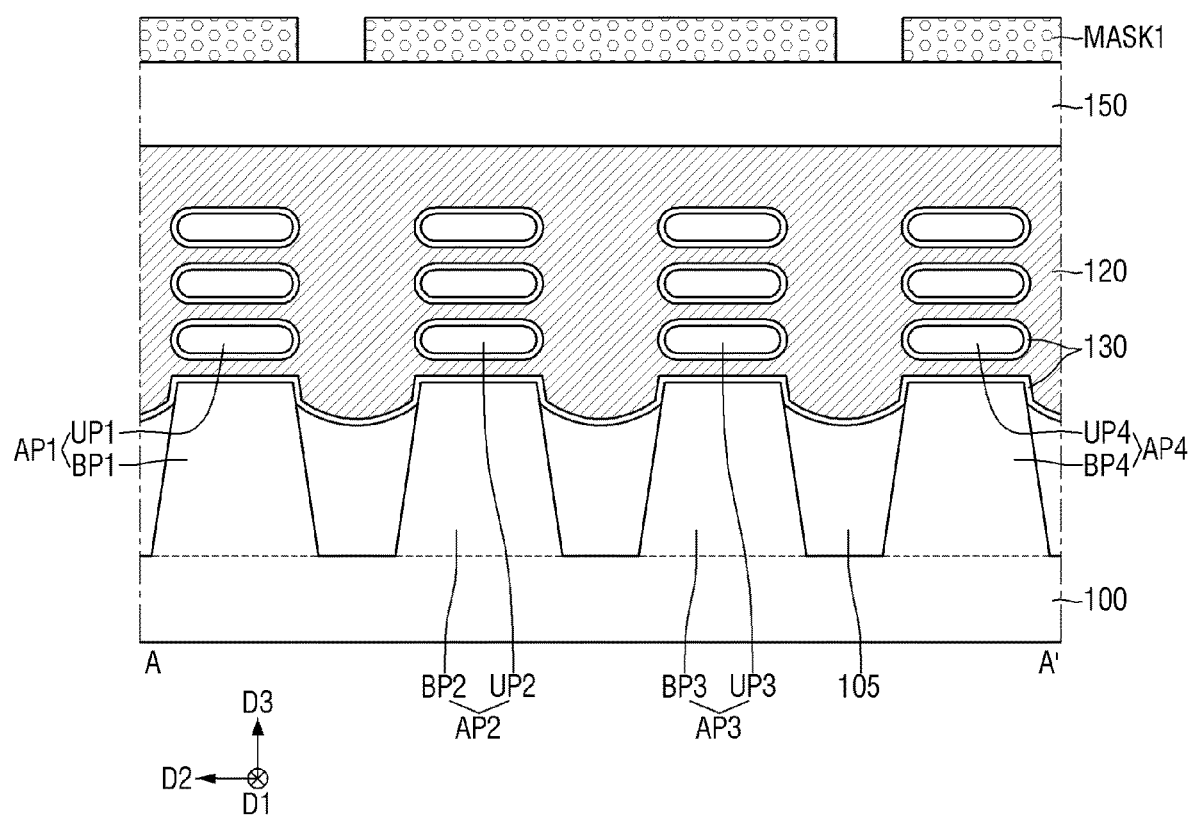
Figure 23:
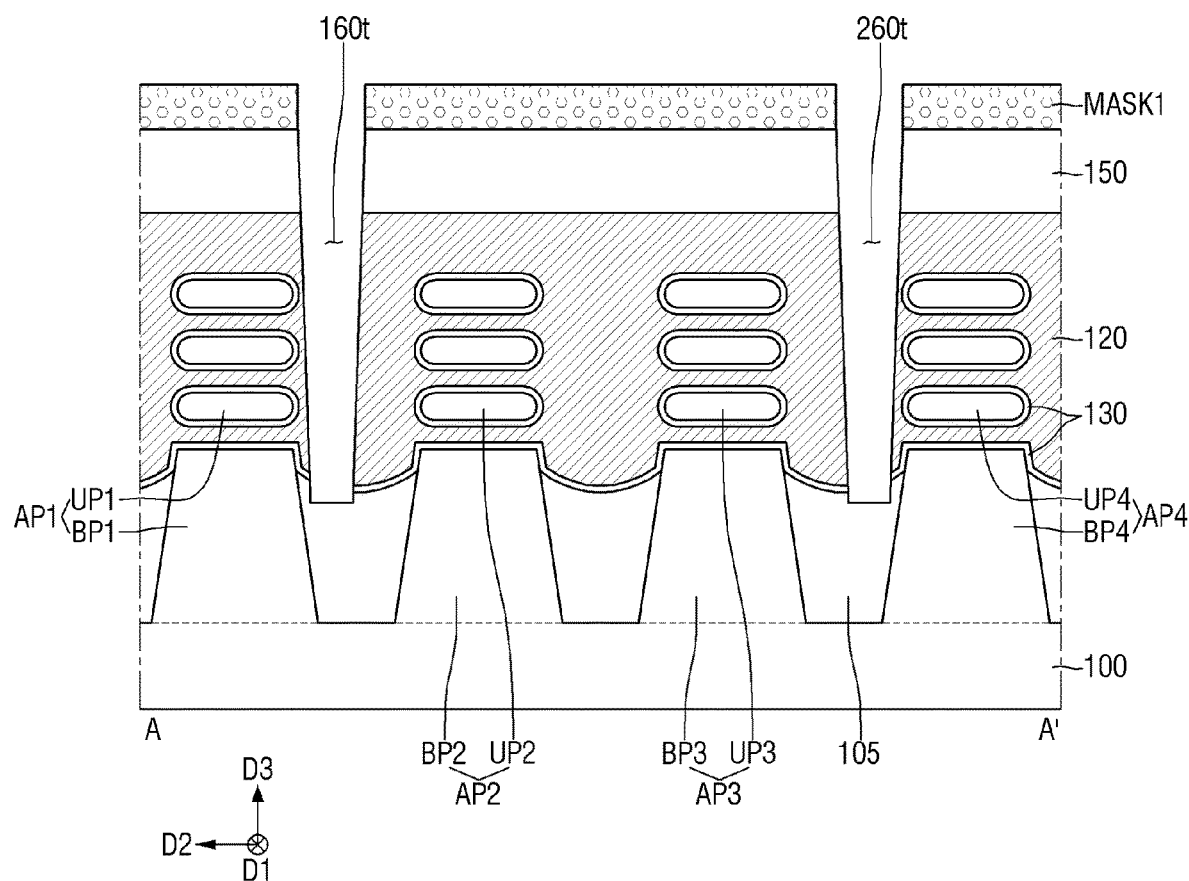

FIG. 21 is a layout diagram of a stage in a method of fabricating a semiconductor device according to some embodiments. FIGS. 22 and 23 are cross-sectional views taken along A-A' of FIG. 21.

Referring to FIGS. 21 and 22, a first mask pattern MASK1 may be formed on the first to fourth active patterns AP1 to AP4 and the gate electrode 120.

Figure 25:
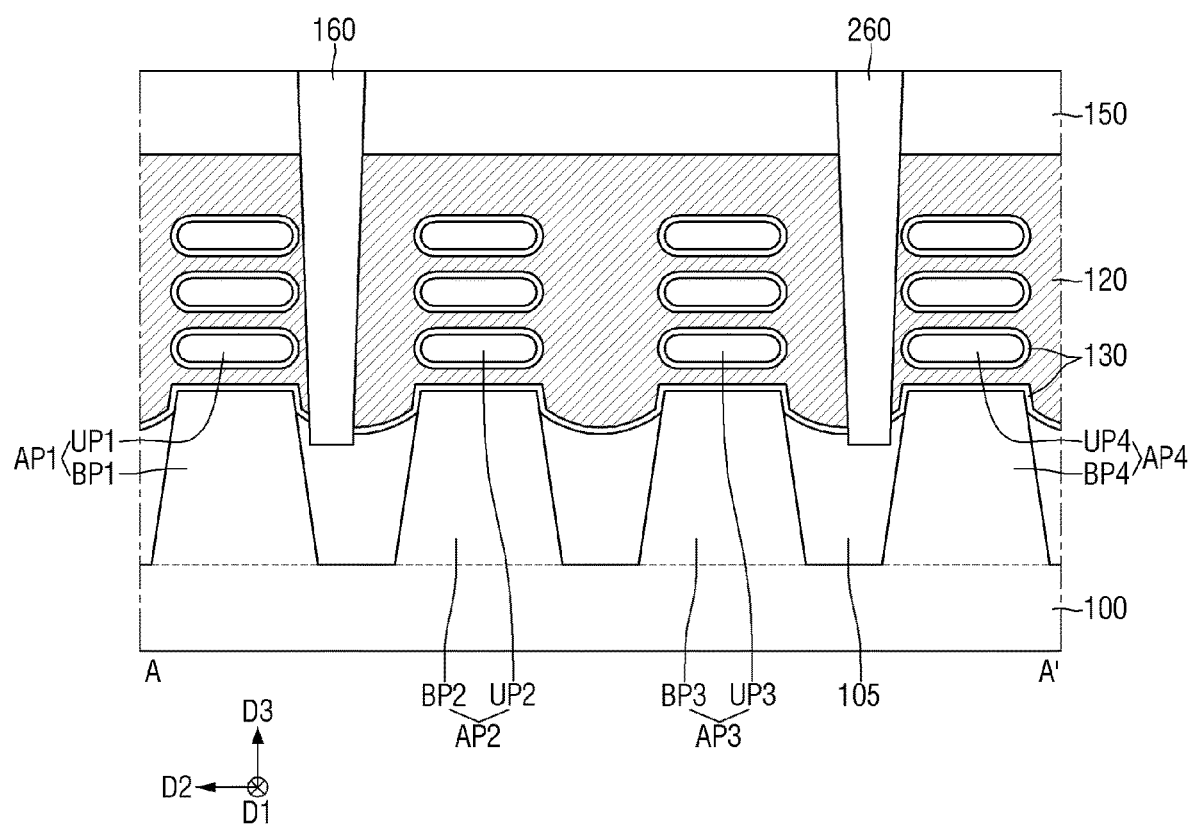

The first mask pattern MASK1 may be a mask for forming a first gate separation structure (e.g., 160 of FIG. 25) and a second gate separation structure (e.g., 260 of FIG. 25).

The first mask pattern MASK1 may not have a bar shape from a planar viewpoint. The first gate separation structure and the second gate separation structure may have a zigzag shape, and the shape of the first mask pattern MASK1 may also vary, depending on the shapes of the first gate separation structure and the second gate separation structure.

Referring to FIG. 23, the gate electrode 120 may be separated, using the first mask pattern MASK1 as a mask.

The gate electrode 120 may be separated to form a first gate separation trench 160t and a second gate separation trench 260t. A bottom side of the first gate separation trench 160t may be formed below the upper side of the field insulating film 105. In an implementation, at least a part of the first gate separation trench 160t may overlap the field insulating film 105 in the second direction D2.

The bottom side of the second gate separation trench 260t may be below the upper side of the field insulating film 105. In an implementation, at least a part of the second gate separation trench 260t may overlap the field insulating film 105 in the second direction D2.

Figure 24:
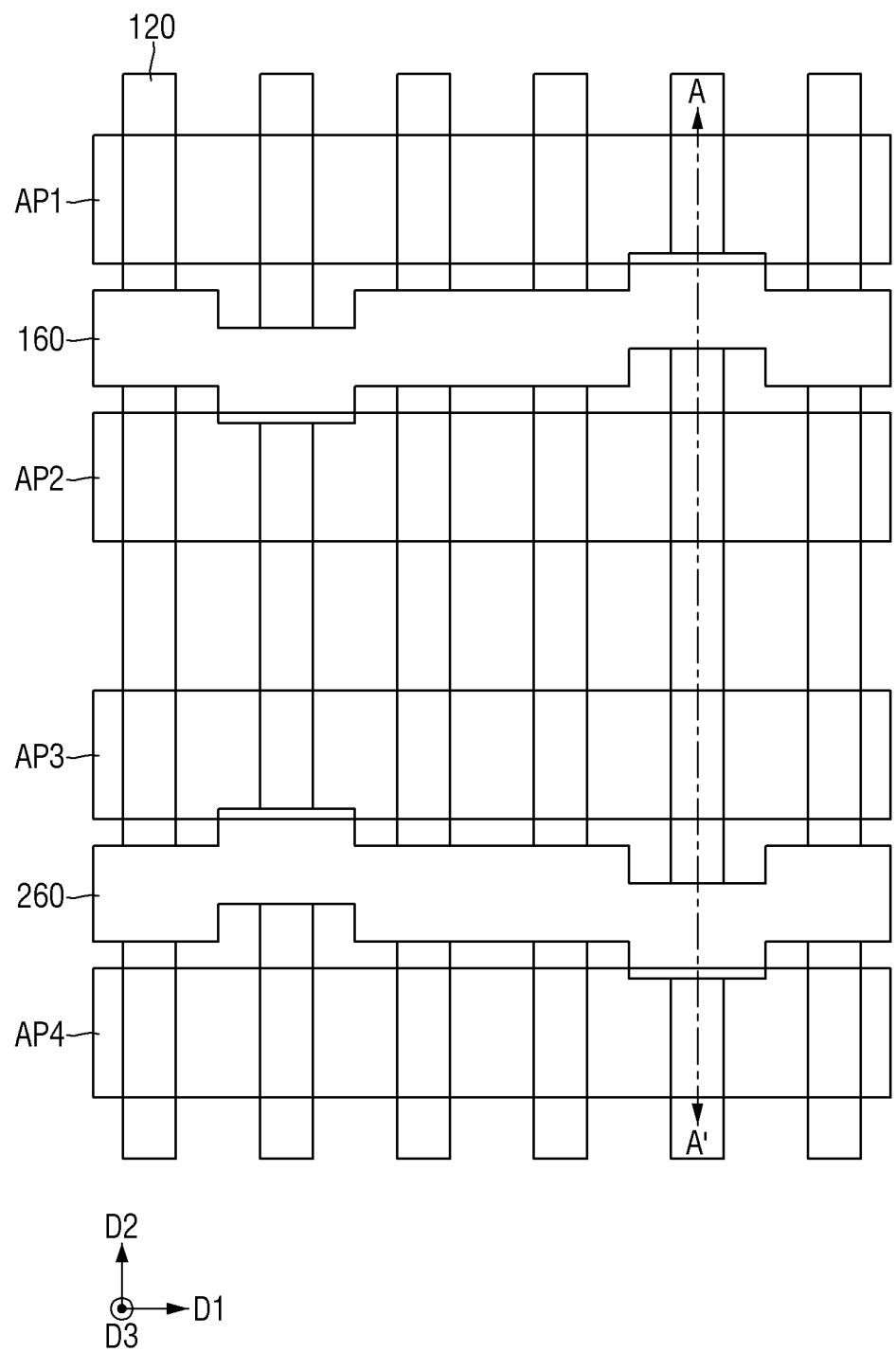

FIG. 24 is a layout diagram of a stage in a method of fabricating a semiconductor device according to some embodiments. FIG. 25 is a cross-sectional view taken along A-A' of FIG. 24.

Referring to FIGS. 24 and 25, the first gate separation structure 160 may fill the first gate separation trench 160t. The second gate separation structure 260 may fill the second gate separation trench 260t.

The first gate separation structure 160 may separate the gate electrode 120 between the first active pattern AP1 and the second active pattern AP2. The second gate separation structure 260 may separate the gate electrode 120 between the third active pattern AP3 and the fourth active pattern AP4.

Subsequently, the first mask pattern MASK1 may be removed.

Figure 26:
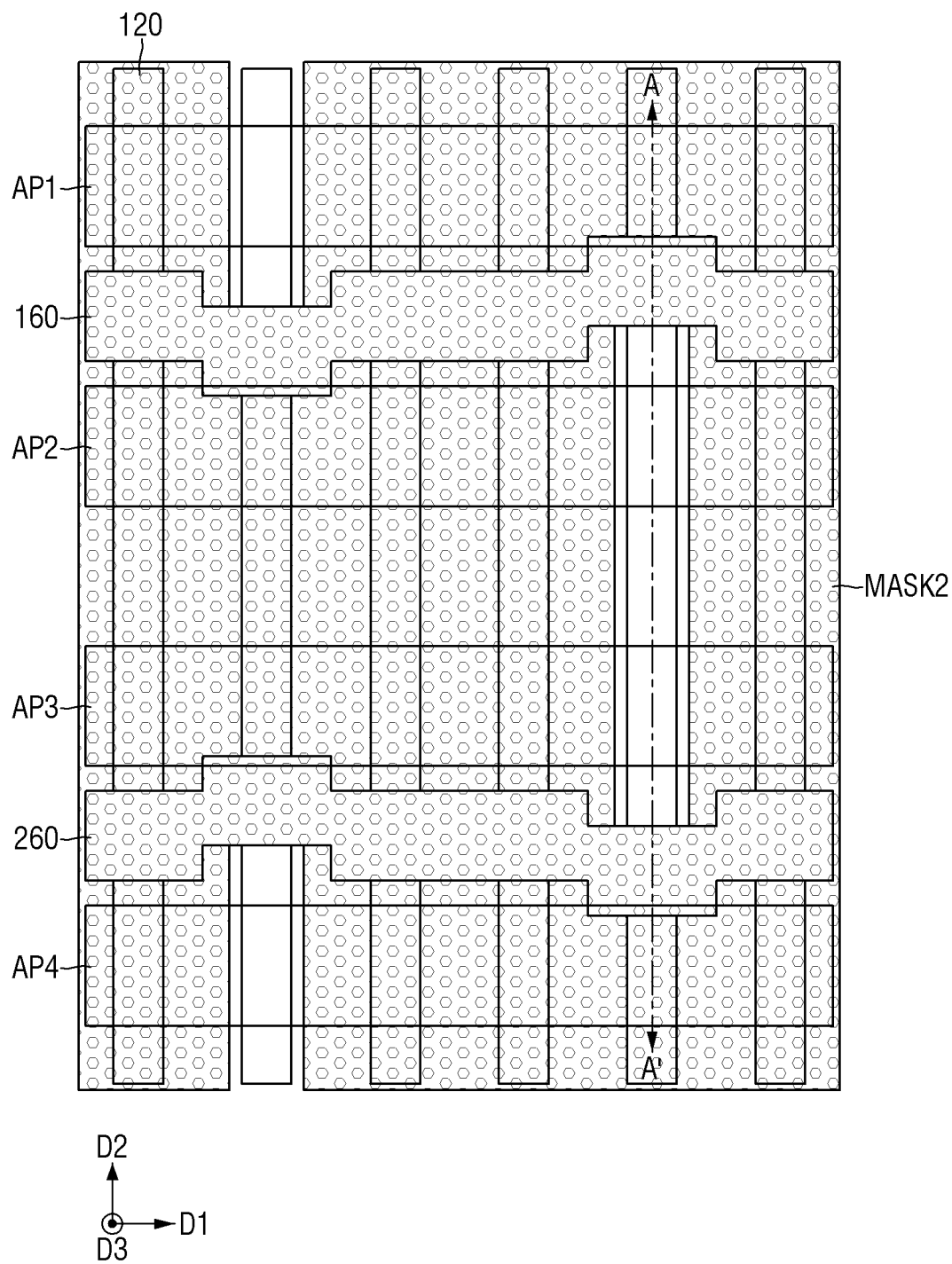
Figure 27:
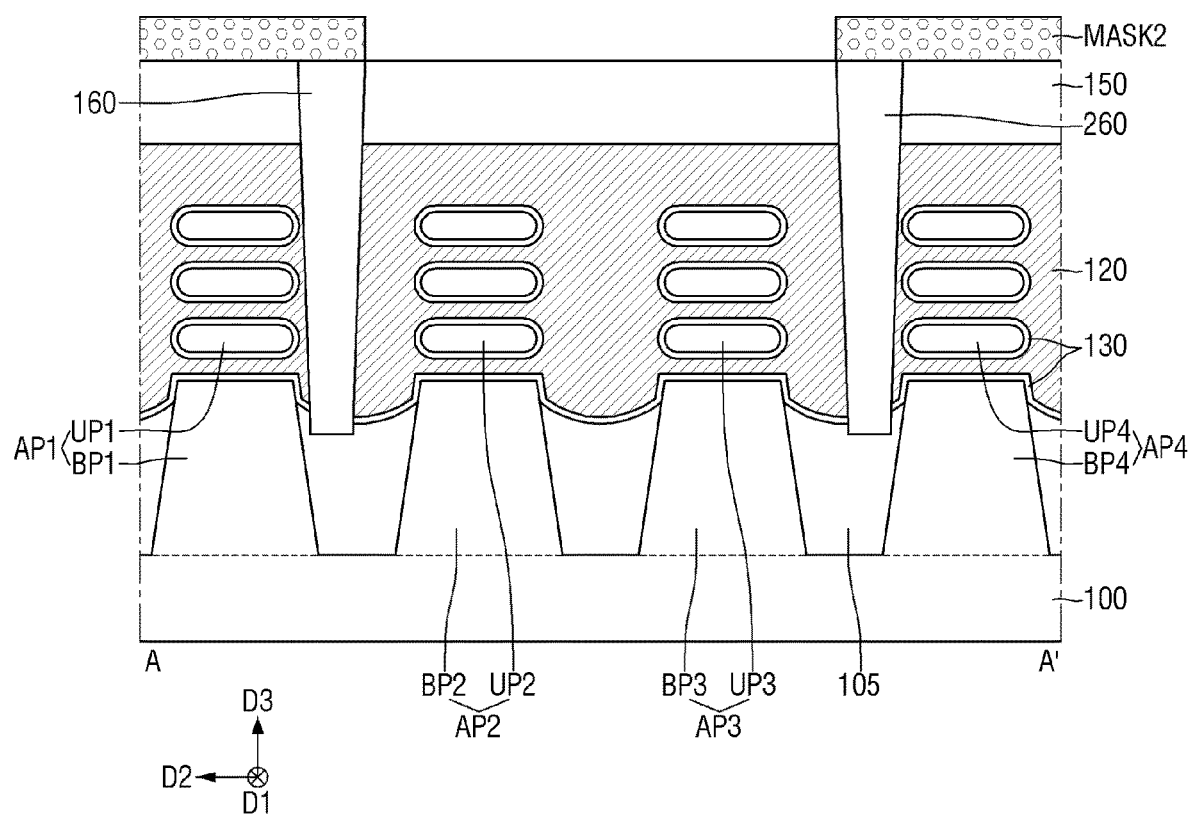
Figure 28:
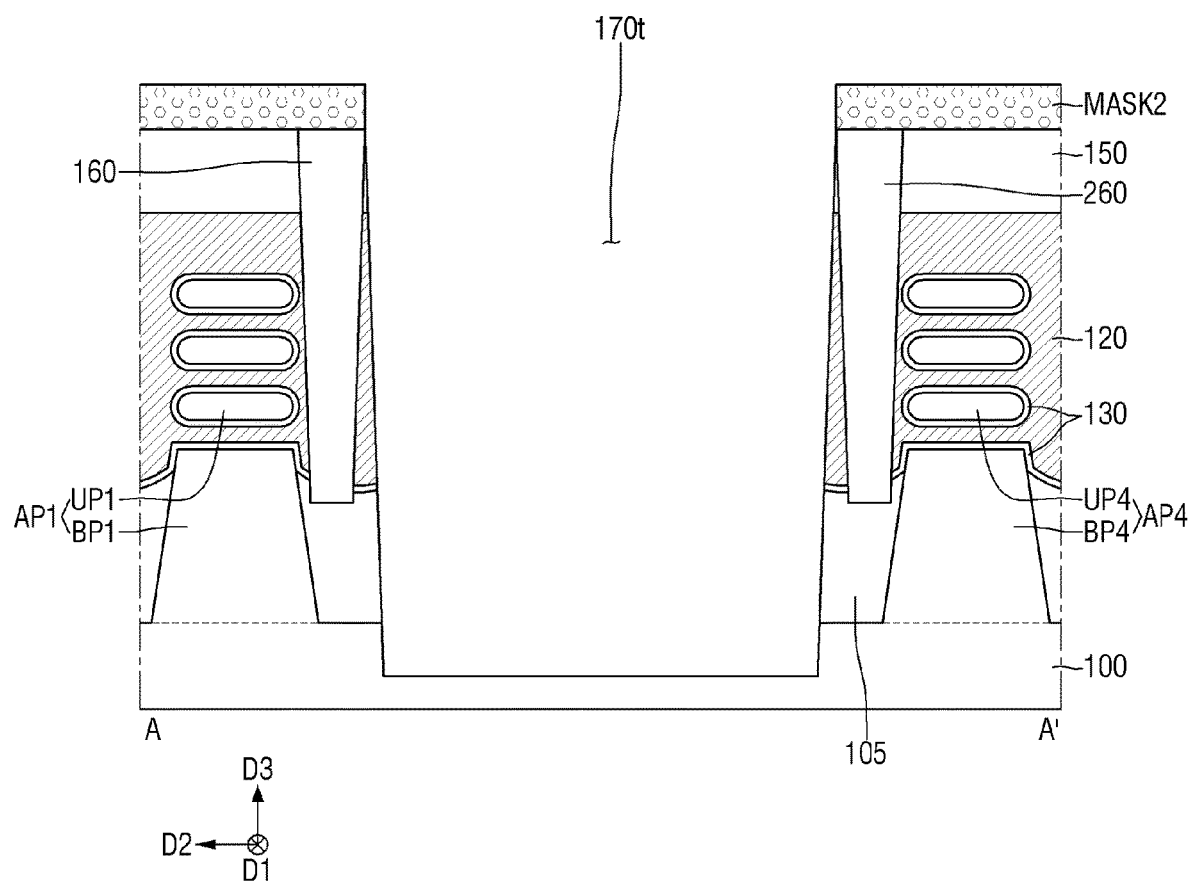

FIG. 26 is a layout diagram of a stage in a method of fabricating a semiconductor device according to some embodiments. FIGS. 27 and 28 are cross-sectional views taken along A-A' of FIG. 26.

Referring to FIGS. 26 and 27, a second mask pattern MASK2 may be formed on the gate capping pattern 150, the first gate separation structure 160, and the second gate separation structure 260.

The second mask pattern MASK2 may be used as a mask for forming the first element separation structure 170.

Referring to FIG. 28, a first element separation trench 170t may be formed, using the second mask pattern MASK2 as a mask.

The first element separation trench 170t may completely separate the second active pattern AP2 and the third active pattern AP3. A bottom side of the first element separation trench 170t may be lower than the bottom side 105BS of the field insulating film 105.

Figure 29:
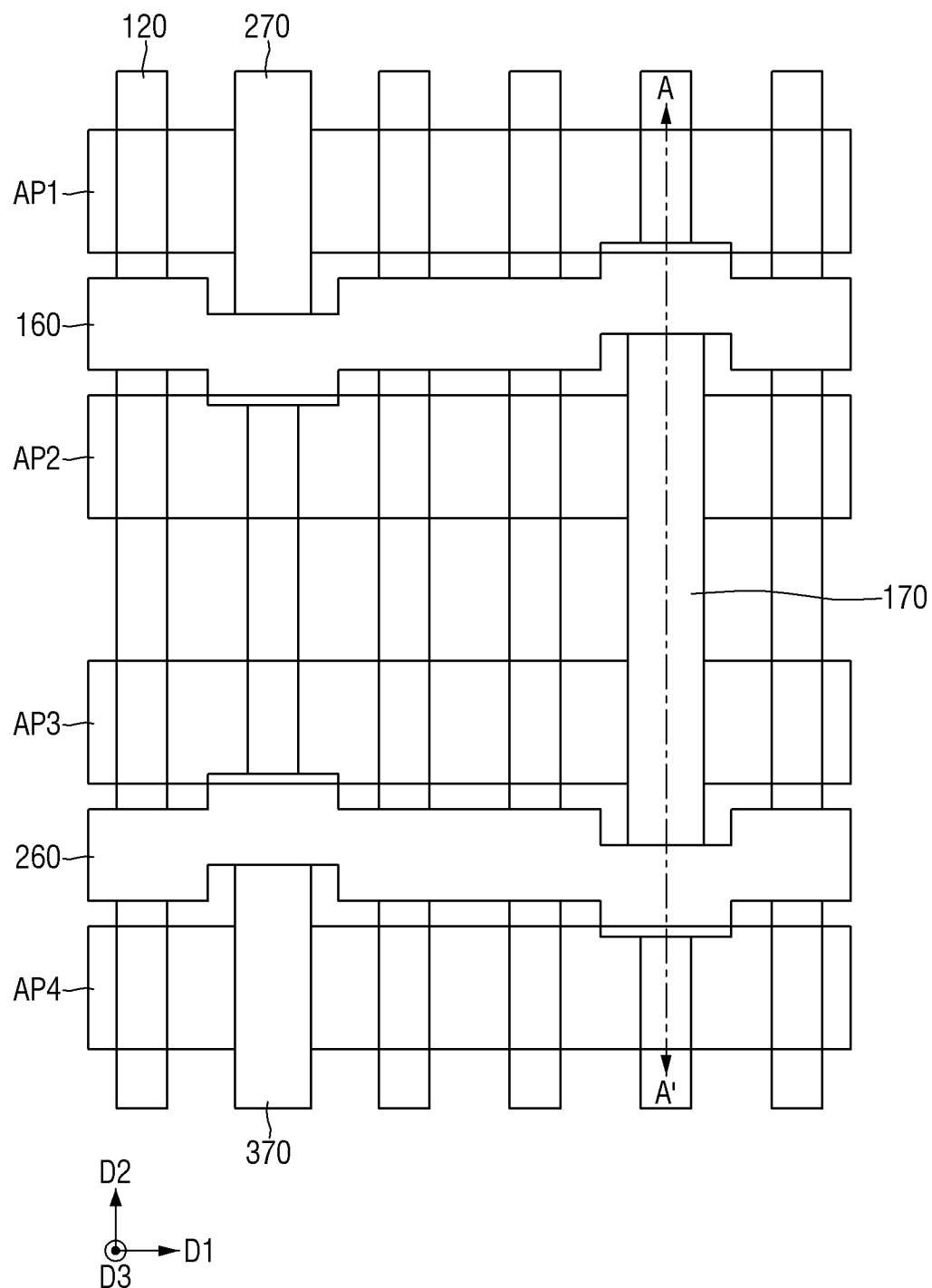
Figure 30:
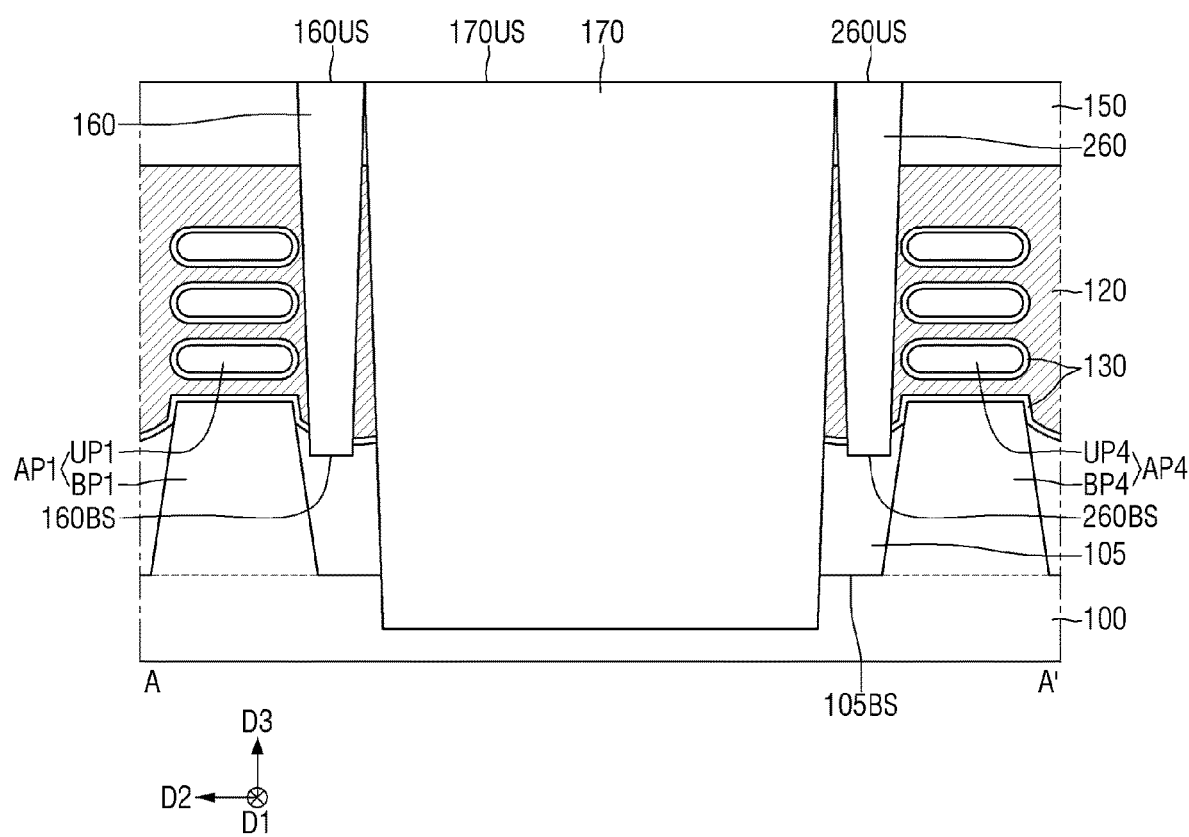

FIG. 29 is a layout diagram of a stage in a method of fabricating a semiconductor device according to some embodiments. FIG. 30 is a cross-sectional view taken along A-A' of FIG. 29.

Referring to FIGS. 29 and 30, the first element separation structure 170 that fills the first element separation trench 170t may be formed. Subsequently, the second mask pattern MASK2 may be removed.

An upper side 170US of the first element separation structure 170 may be on the same plane as the upper side 160US of the first gate separation structure 160, the upper side 150US of the gate capping pattern 150, and the upper side 260US of the second gate separation structure 260.

By way of summation and review, as a pitch size decreases, the technique of electrically separating the integrated elements may be emphasized and activated. A separation technology used in scaled elements may use ultra-miniaturization.

One or more embodiments may provide a semiconductor device capable of improving element performance and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a first active pattern on the substrate and extending in a first direction;
a second active pattern on the substrate, extending in the first direction, and being spaced apart from the first active pattern in a second direction intersecting and perpendicular to the first direction;
gate electrodes on the first active pattern and the second active pattern and extending in the second direction to intersect the first active pattern and the second active pattern;
a non-linear first gate separation structure between the first active pattern and the second active pattern, the non-linear first gate separation structure extending in the first direction and separating the gate electrodes into separate parts; and
a first element separation structure between the gate electrodes, the first element separation structure extending in the second direction and separating the second active pattern into separate parts,
wherein:
the non-linear first gate separation structure includes a first side facing the second active pattern, and a second side opposite to the first side,
from a planar viewpoint, a distance in the second direction from the second active pattern to the first side of a first portion of the non-linear first gate separation structure is smaller than a distance in the second direction from the second active pattern to the first side of a second portion of the non-linear first gate separation structure, and
a distance in the second direction from the second active pattern to the second side of the first portion is smaller than a distance in the second direction from the second active pattern to the second side of the second portion.

2. The semiconductor device as claimed in claim 1, wherein the first element separation structure overlaps the second portion of the non-linear first gate separation structure in the second direction.

3. The semiconductor device as claimed in claim 1, wherein the non-linear first gate separation structure further includes a connecting portion that connects the first portion and the second portion and extends in an inclined angle as compared to the first portion and the second portion, the first portion and the second portion both extending in the first direction.

4. The semiconductor device as claimed in claim 3, wherein a width of the connecting portion in the second direction gradually decreases from the first portion toward the second portion.

5. The semiconductor device as claimed in claim 1, wherein the first portion of the non-linear first gate separation structure overlaps at least a part of the first element separation structure in the first direction.

6. The semiconductor device as claimed in claim 1, wherein:
the non-linear first gate separation structure further includes a third portion, the first portion being between the second portion and the third portion,
from the planar viewpoint, a distance in the second direction from the second active pattern to the first side of the third portion is smaller than a distance in the second direction from the second active pattern to the first side of the first portion, and
a distance in the second direction from the second active pattern to the second side of the third portion is smaller than a distance in the second direction from the second active pattern to the second side of the first portion.

7. The semiconductor device as claimed in claim 6, further comprising a second element separation structure between the gate electrodes, the second element separation structure extending in the second direction and separating the first active pattern into separate parts,
wherein the second element separation structure overlaps the third portion of the non-linear first gate separation structure in the second direction.

8. The semiconductor device as claimed in claim 6, wherein, from the planar viewpoint, the distance in the second direction from the second active pattern to the second side of the third portion is smaller than the distance in the second direction from the second active pattern to the first side of the second portion.

9. The semiconductor device as claimed in claim 1, wherein a width of the first portion in the second direction is the same as a width of the second portion in the second direction.

10. The semiconductor device as claimed in claim 1, wherein a width of the first portion in the second direction is greater than a width of the second portion in the second direction.

11. The semiconductor device as claimed in claim 1, further comprising a third active pattern and a fourth active pattern extending in the first direction and being spaced apart from the second active pattern in the second direction,
wherein:

the third active pattern is between the second active pattern and the fourth active pattern and the first active pattern is on an opposite side of the second active pattern from the third active pattern in the second direction, and a non-linear second gate separation structure extending in the first direction is further included between the third active pattern and the fourth active pattern.

12. The semiconductor device as claimed in claim 11, wherein the first element separation structure is between the non-linear first gate separation structure and the non-linear second gate separation structure, and separates the third active pattern into separate parts.

13. A semiconductor device, comprising:
a substrate;
a first active pattern on the substrate and extending in a first direction;
a second active pattern on the substrate, the second active pattern extending in the first direction and being spaced apart from the first active pattern in a second direction intersecting and perpendicular to the first direction;
gate electrodes on the first active pattern and the second active pattern and extending in the second direction to intersect the first active pattern and the second active pattern;
a non-linear gate separation structure between the first active pattern and the second active pattern, the non-linear gate separation structure extending in the first direction and separating the gate electrodes into separate parts; and
an element separation structure between the gate electrodes, the element separation structure extending in the second direction and separating the second active pattern into two separate parts,
wherein at least a part of a bottom side of the non-linear gate separation structure overlaps the first active pattern in a third direction that intersects the first direction and the second direction.

14. The semiconductor device as claimed in claim 13, wherein:
the first active pattern includes a lower pattern and a plurality of sheet patterns spaced apart from the lower pattern in the third direction,
the semiconductor device further comprises a gate insulating film that surrounds the sheet patterns, and
the non-linear gate separation structure contacts at least a part of the gate insulating film.

15. The semiconductor device as claimed in claim 13, wherein the bottom side of the non-linear gate separation structure is higher than a bottom side of the element separation structure, as measured from the substrate.

16. The semiconductor device as claimed in claim 13, wherein the element separation structure overlaps at least a part of the non-linear gate separation structure in the first direction.

17. The semiconductor device as claimed in claim 13, wherein an upper side of the non-linear gate separation structure is on a same plane as an upper side of the element separation structure.

18. A semiconductor device, comprising:
a substrate;
a first active pattern, a second active pattern, a third active pattern, and a fourth active pattern on the substrate, the first to fourth active patterns extending in a first direction and being spaced apart from each other in a second direction intersecting and perpendicular to the first direction;
gate electrodes on the first to fourth active patterns and extending in the second direction to intersect the first to fourth active patterns;
a non-linear first gate separation structure between the first active pattern and the second active pattern, the non-linear first gate separation structure extending in the first direction, and separating corresponding gate electrodes into separate parts;
a non-linear second gate separation structure between the third active pattern and the fourth active pattern, the non-linear second gate separation structure extending in the first direction, and separating corresponding gate electrodes into separate parts; and
an element separation structure between the gate electrodes, the element separation structure extending in the second direction, and separating each of the second active pattern and the third active pattern into separate parts,
wherein:
the non-linear first gate separation structure includes a first side facing the second active pattern and a second side opposite to the first side,
the non-linear second gate separation structure includes a third side facing the fourth active pattern and a fourth side opposite to the third side,
from a planar viewpoint:
a distance in the second direction from the second active pattern to the first side of a first portion of the non-linear first gate separation structure is smaller than a distance in the second direction from the second active pattern to the first side of a second portion of the non-linear first gate separation structure,
a distance in the second direction from the second active pattern to the second side of the first portion of the non-linear first gate separation structure is smaller than a distance in the second direction from the second active pattern to the second side of the second portion of the non-linear first gate separation structure,
a distance in the second direction from the fourth active pattern to the third side of a first portion of the non-linear second gate separation structure is greater than a distance in the second direction from the fourth active pattern to the third side of a second portion of the non-linear second gate separation structure, and
a distance in the second direction from the fourth active pattern to the fourth side of the first portion of the non-linear second gate separation structure is greater than a distance in the second direction from the fourth active pattern to the fourth side of the second portion of the non-linear second gate separation structure, and
the element separation structure is between the second portion of the non-linear first gate separation structure and the second portion of the non-linear second gate separation structure.

19. The semiconductor device as claimed in claim 18, wherein a width of the element separation structure in the second direction is greater than a distance between the first portion of the non-linear first gate separation structure and the first portion of the non-linear second gate separation structure in the second direction.

20. The semiconductor device as claimed in claim 18, wherein, from the planar viewpoint, the non-linear first gate separation structure and the non-linear second gate separation structure are symmetrical to each other about a line passing therebetween in the first direction.

\* \* \* \* \*